(12) United States Patent
Sporea et al.

(10) Patent No.: US 11,996,485 B2
(45) Date of Patent: May 28, 2024

(54) MULTIPLE-GATE TRANSISTOR

(71) Applicant: University of Surrey, Guildford (GB)

(72) Inventors: Radu Alexandru Sporea, Guildford (GB); Eva Bestelink, Guildford (GB)

(73) Assignee: University of Surrey, Guildford (GB)

( * ) Notice: Subject to any disclaimer, the term of this patent is extended or adjusted under 35 U.S.C. 154(b) by 400 days.

(21) Appl. No.: 17/298,323

(22) PCT Filed: Nov. 29, 2019

(86) PCT No.: PCT/GB2019/053383
§ 371 (c)(1),
(2) Date: May 28, 2021

(87) PCT Pub. No.: WO2020/109816
PCT Pub. Date: Jun. 4, 2020

(65) Prior Publication Data
US 2022/0029027 A1    Jan. 27, 2022

(30) Foreign Application Priority Data
Nov. 30, 2018 (GB) ...................... 1819570

(51) Int. Cl.
*H01L 29/786* (2006.01)
*H10K 10/46* (2023.01)

(52) U.S. Cl.
CPC ..... *H01L 29/78645* (2013.01); *H10K 10/482* (2023.02); *H01L 29/78696* (2013.01); *H10K 10/484* (2023.02)

(58) Field of Classification Search
CPC ........ H01L 29/78645; H01L 29/78696; H10K 10/482; H10K 10/484
See application file for complete search history.

(56) References Cited

U.S. PATENT DOCUMENTS 5,438,220 A * 8/1995 Nakagawa .......... H01L 29/8611
                                                        257/E29.279
5,475,238 A * 12/1995 Hamada ................ H01L 29/405
                                                      257/E29.279

(Continued)

FOREIGN PATENT DOCUMENTS

CN        1675772 A      9/2005
CN      104508829 A      4/2015

(Continued)

OTHER PUBLICATIONS

European Patent Office, International Search Report and Written Opinion, International Application No. PCT/GB2019/053383, dated Jun. 25, 2020, 5 pages.

(Continued)

*Primary Examiner* — Nathan W Ha
(74) *Attorney, Agent, or Firm* — Ryan Dean; Umberg Zipser LLP

(57) ABSTRACT

A multiple-gate transistor comprises a source, a drain spaced apart from the source, a semiconductor region disposed between the source and drain, and an insulating region disposed over the semiconductor region. A current control gate controls a magnitude of current flowing between the source and drain through the semiconductor region in dependence on a first electric field applied to the current control gate, and is separated from the source by the semiconductor region and the insulating region. A switching gate permits current to flow between the source and drain through the semiconductor region in dependence on a second electric field applied to the switching gate. The transistor's conduction state can be controlled by varying the second electric field applied to the switching gate, whilst varying the first electric field that is applied to the current control gate can set (Continued)

the magnitude of the current through the multiple-gate transistor.

20 Claims, 14 Drawing Sheets

(56) References Cited

U.S. PATENT DOCUMENTS

| | | | | |
|---|---|---|---|---|
| 6,388,271 | B1* | 5/2002 | Mitlehner | H01L 29/7436 257/E29.279 |
| 8,936,965 | B2* | 1/2015 | Imoto | H10K 10/482 257/43 |
| 9,006,710 | B2* | 4/2015 | Lee | H01L 29/0673 257/29 |
| 10,038,061 | B2* | 7/2018 | Ning | H01L 21/265 |
| 2004/0004235 | A1* | 1/2004 | Lee | B82Y 10/00 257/288 |
| 2004/0144972 | A1* | 7/2004 | Dai | G11C 13/025 257/20 |
| 2004/0160823 | A1* | 8/2004 | Owen | G11C 16/3468 365/185.1 |
| 2005/0052223 | A1* | 3/2005 | Sakhuja | G05F 3/262 327/543 |
| 2006/0169972 | A1* | 8/2006 | Furukawa | H01L 21/823412 257/E21.629 |
| 2009/0206237 | A1 | 8/2009 | Shannon et al. | |
| 2011/0127523 | A1* | 6/2011 | Yamazaki | H01L 29/2206 257/E29.296 |
| 2012/0097941 | A1* | 4/2012 | Yamazaki | H01L 29/7869 257/43 |
| 2012/0132902 | A1* | 5/2012 | Imoto | H01L 29/66742 257/43 |
| 2013/0088283 | A1* | 4/2013 | Lee | H01L 29/78645 257/29 |
| 2014/0027758 | A1* | 1/2014 | Hong | H01L 29/78645 257/E29.095 |
| 2015/0357604 | A1* | 12/2015 | Muccini | H10K 10/482 257/40 |
| 2016/0379562 | A1* | 12/2016 | Yoon | G09G 3/3233 345/215 |
| 2017/0069386 | A1* | 3/2017 | Song | G11C 16/3481 |
| 2018/0182302 | A1* | 6/2018 | Yoo | G09G 3/3233 |
| 2018/0254351 | A1* | 9/2018 | Jung | H10K 10/482 |
| 2019/0013810 | A1* | 1/2019 | Friedman | G06F 7/501 |
| 2019/0074304 | A1* | 3/2019 | Lee | H01L 29/78645 |

FOREIGN PATENT DOCUMENTS

| | | |
|---|---|---|
| EP | 1655791 A1 | 5/2006 |
| EP | 2858116 A1 | 4/2015 |
| EP | 3104416 A1 | 12/2016 |
| JP | H06151851 A | 5/1994 |

OTHER PUBLICATIONS

China Patent Office, Office Action, dated Sep. 29, 2023.

* cited by examiner

MULTIPLE-GATE TRANSISTOR

TECHNICAL FIELD

The present invention relates to semiconductor transistor technology. More particularly, the present invention relates to a transistor comprising a source, a drain and a plurality of gates.

BACKGROUND

Printing electronics on flexible substrates has received growing interest, specifically for large area electronics, such as display technology, sensors, wearables and other applications where roll-to-roll fabrication would allow for quick, cost-effective fabrication. However, several limitations have been encountered, most notably, poor device performance under electrical stress, which usually limits circuit speed to hundreds of kilohertz (kHz).

Transistors have been developed in which the source contact contains a potential barrier, for example a Schottky contact, the gate overlaps the source, and the semiconductor is thin enough to allow the voltage applied to the drain contact to fully deplete the semiconductor of free carriers at the edge of the source. Such transistors are commonly referred to as source-gated transistors (SGTs). The SGT offers several advantages over conventional field-effect thin-film transistors (FET TFTs), including lower operating voltages, reduced power consumption, and high gain due to low output conductance.

These advantages make SGTs particularly suitable for use in large area and flexible electronics where current uniformity is a requirement. However, one significant disadvantage of the SGT design is its speed. Due to its lower drain current in comparison to FETs or other types of TFT, transconductance is reduced, which in turn impacts the operating frequency and limits SGTs to switching speeds considerably lower than those of TFTs of identical geometry. Consequently, the SGT is not suited to radio frequency (RF) and other high speed applications. There is therefore a need in the art for a transistor which offers the advantages of an SGT with a faster switching speed.

SUMMARY OF THE INVENTION

According to a first aspect of the present invention, there is provided a multiple-gate transistor comprising: a source; a drain spaced apart from the source; a semiconductor region disposed between the source and the drain; an insulating region disposed over the semiconductor region; a current control gate for controlling a magnitude of current flowing between the source and the drain through the semiconductor region in dependence on a first electric field applied to the current control gate, the current control gate being separated from the source by the semiconductor region and the insulating region; and a switching gate for permitting current to flow between the source and the drain through the semiconductor region in dependence on a second electric field applied to the switching gate.

In some embodiments according to the first aspect, the drain is laterally spaced apart from the source, the semiconductor region is disposed over the source and the drain, and the current control and switching gates are disposed on an opposite side of the semiconductor region to the source and the drain.

In some embodiments according to the first aspect, the current control gate and the switching gate are disposed at the same height above the source and drain, wherein the current control gate or the switching gate further comprises a portion extending above a gap separating the current control gate from the switching gate.

In some embodiments according to the first aspect, the portion of the current control gate or the switching gate extends at least to the same lateral position as an adjacent edge of the other one of the current control gate and the switching gate, and the portion of the current control gate or the switching gate is vertically separated from the edge of the other one of the current control gate and the switching gate.

In some embodiments according to the first aspect, the current control gate is vertically offset from the switching gate.

In some embodiments according to the first aspect, the current control gate extends in a lateral direction at least up to an edge of the switching gate, the current control gate being vertically separated from the switching gate by an electrically insulating region.

In some embodiments according to the first aspect, the switching gate is disposed so as to cause creation of a conductive layer in part of the semiconductor region between the source and the drain when the second electric field is applied to the switching gate.

In some embodiments according to the first aspect, the multiple-gate transistor further comprises a gate terminal disposed above at least part of the current control gate and at least part of the switching gate, wherein a third electric field sufficient to generate the first and second electric fields is applied to the gate terminal, and wherein the current control gate and the switching gate act as floating gates.

In some embodiments according to the first aspect, the gate terminal extends across the length of the current control gate and the switching gate.

In some embodiments according to the first aspect, the multiple-gate transistor comprises a plurality of switching gates including said switching gate, wherein each of the plurality of switching gates are electrically isolated from other ones of the plurality of switching gates, such that current is only permitted to flow between the source and drain through the semiconductor region when a voltage applied to each one of the plurality of switching gates is equal to or greater than a respective switching threshold voltage for said one of the plurality of switching gates.

In some embodiments according to the first aspect, the multiple-gate transistor further comprises a plurality of inputs each connected to a respective one of the plurality of switching gates, and an output connected to the drain, such that the multiple-gate transistor is configured to perform an AND function by only permitting current to flow at the output if voltages at all of the plurality of inputs are equal to or greater than the switching threshold voltage.

In some embodiments according to the first aspect, the multiple-gate transistor comprises a plurality of current control gates including said current control gate, wherein the plurality of current control gates are spaced apart from one another in a direction parallel to an edge of the source adjacent to a channel between the source and the drain and are each configured to receive a respective one of a plurality of input voltages, such that the magnitude of current flowing between the source and the drain is dependent on the plurality of input voltages.

In some embodiments according to the first aspect, each one of the plurality of current control gates is configured to receive a respective digit of an input digital codeword comprising a plurality of digits, such that the multiple-gate transistor is configured to convert the input digital codeword to an analogue output current at the drain.

In some embodiments according to the first aspect, the plurality of digits of the input digital codeword comprises n bits and the multiple-gate transistor comprises n current control gates each having a different area of overlap with the source, and wherein the areas of overlap of the current control gates increase from the first to the $n^{th}$ current control gate following a geometric progression with common ratio r=2.

In some embodiments according to the first aspect, the semiconductor region comprises a first doped region between the source and the first gate, and a second doped region disposed in a channel between the source and the drain.

In some embodiments according to the first aspect, the first doped region is configured to operate in a normally on mode and the second doped region is configured to operate in a normally off mode, or the first doped region is configured to operate in the normally off mode and the second doped region is configured to operate in the normally on mode.

In some embodiments according to the first aspect, the multiple-gate transistor comprises an auxiliary gate disposed on an opposite side of the semiconductor region to the switching gate, wherein a threshold voltage at which the switching gate permits current to flow between the source and the drain is dependent on a voltage applied to the auxiliary gate.

In some embodiments according to the first aspect, the multiple-gate transistor comprises a field-relief element configured to extend beyond an edge of the source nearest to the drain, in a direction towards the drain, so as to at least partially shield the source from an electric field in a channel between the source and the drain.

In some embodiments according to the first aspect, the first and/or second electric field is an applied voltage, or is a field generated by incident electromagnetic radiation via the photovoltaic effect, or is an electric field generated by chemical adsorption.

According to a second aspect of the present invention, there is provided a method of operating a multiple-gate transistor comprising a source, a drain spaced apart from the source, a semiconductor region disposed between the source and the drain, an insulating region disposed over the semiconductor region, a current control gate for controlling a magnitude of current flowing between the source and the drain through the semiconductor region in dependence on a first electric field applied to the current control gate, the current control gate being separated from the source by the semiconductor region and the insulating region, and a switching gate for permitting current to flow between the source and the drain through the semiconductor region in dependence on a second electric field applied to the switching gate, the method comprising: applying the second electric field to the switching gate to permit current to flow in the semiconductor region between the source and the drain; and using the current control gate to control the magnitude of the current flowing in the semiconductor region between the source and the drain.

In some embodiments according to the second aspect, the applied second electric field is greater than or equal to a threshold switching electric field.

In some embodiments according to the second aspect, using the current control gate to control the magnitude of the current comprises applying the first electric field to the current control gate, and the multiple-gate transistor is subsequently switched on by increasing the second electric field applied to the switching gate to at least the threshold switching electric field.

In some embodiments according to the second aspect, the multiple-gate transistor comprises a plurality of switching gates including said switching gate, each of the plurality of switching gates being electrically isolated from other ones of the plurality of switching gates such that current is only permitted to flow between the source and drain through the semiconductor region when a respective second electric field applied to each one of the plurality of switching gates is equal to or greater than a respective switching threshold electric field for said one of the plurality of switching gates, the method further comprising applying the respective second electric field greater than or equal to the respective threshold switching electric field to each one of the plurality of switching gates.

In some embodiments according to the second aspect, each one of a plurality of inputs is connected to a respective one of the plurality of switching gates and an output is connected to the drain, such that the multiple-gate transistor is configured to perform an AND function by only permitting current to flow at the output if the respective second electric fields at all of the plurality of inputs are equal to or greater than the respective switching threshold electric fields. Also, the magnitude of the output current can be controlled by varying the first electric field applied to the current control gate.

In some embodiments according to the second aspect, the first and/or second electric field is an applied voltage, or is an electric field generated by incident electromagnetic radiation via the photovoltaic effect, or is an electric field generated by chemical adsorption.

BRIEF DESCRIPTION OF THE DRAWINGS

Embodiments of the present invention will now be described, by way of example only, with reference to the accompanying drawings, in which.

DETAILED DESCRIPTION

Figure 1:
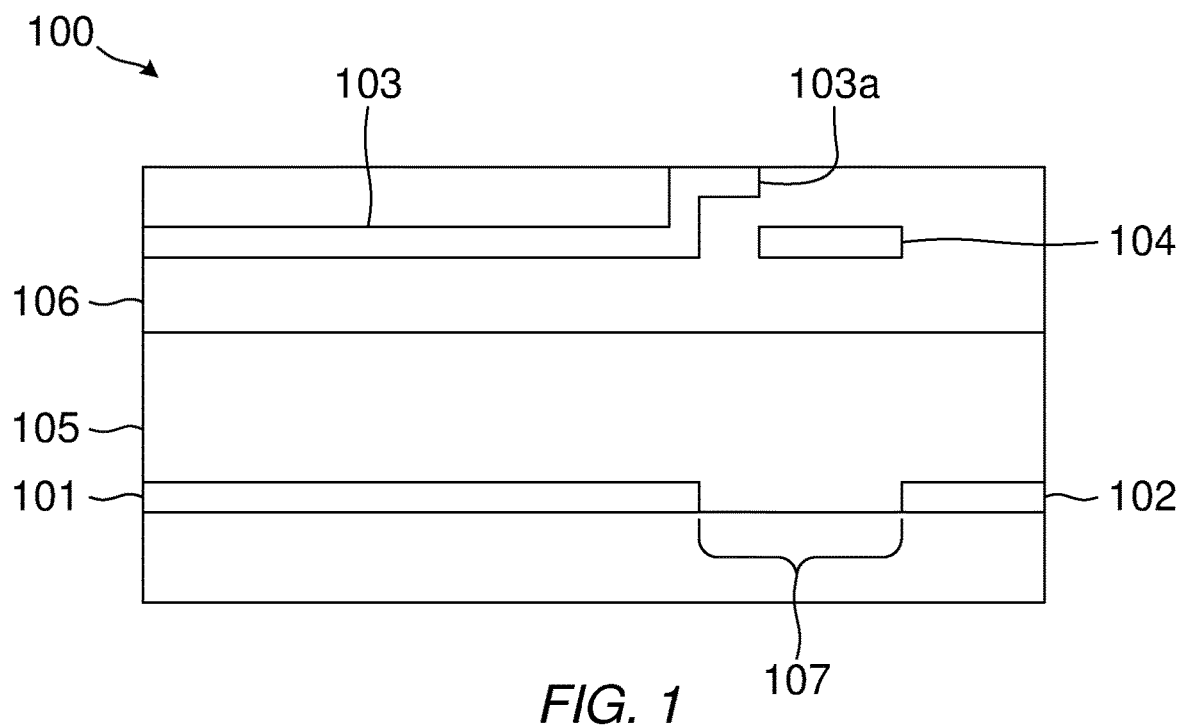
FIG. 1 illustrates a multiple-gate transistor comprising a current control gate and a switching gate, according to an embodiment of the present invention.

In the following detailed description, only certain exemplary embodiments of the present invention have been shown and described, simply by way of illustration. As those skilled in the art would realize, the described embodiments may be modified in various different ways, all without departing from the scope of the present invention. Accordingly, the drawings and description are to be regarded as illustrative in nature and not restrictive. Like reference numerals designate like elements throughout the specification.

For convenience, in the following description various device geometries according to embodiments of the invention are described in relation to devices in the orientations shown in the drawings. Where terms such as "over", "above", "lateral", "vertical" and so on are used in the description, these should not be construed as meaning that such embodiments are restricted to the specific orientations shown in the drawings. It should be readily appreciated that the devices described herein will be capable of functioning correctly regardless of the physical orientation of the device, or of an apparatus in which the device is included, and as such the following description should be interpreted accordingly. Furthermore, transistors according to embodiments of the present invention comprise a semiconductor region which may comprise a semiconductor, a semimetal or a degenerately doped semiconductor, or a combination thereof. As such, references to a "semiconductor region" herein should be construed accordingly.

Referring now to FIG. 1, a multiple-gate transistor comprising a current control gate and a switching gate is illustrated, according to an embodiment of the present invention. The multiple-gate transistor 100 comprises a source 101, a drain 102, a first gate 103 and a second gate 104. The source 101 and drain 102 are spaced apart from each other and separated by a semiconductor region 105. In other words, the source 101 and the drain 102 are separated by the semiconductor region 105. The contact between the source 101 and the semiconductor 105 comprises a potential barrier. For example, a potential barrier between the source 101 and the semiconductor 105 may be provided by selecting suitable materials for the source 101 and the semiconductor region 105, by doping the material of the source 101 and/or the semiconductor region 105, or by forming a heterojunction contact between two or more semiconductor materials.

The source 101, drain 102, first gate 103, second gate 104, and semiconductor region 105 may each be formed from any suitable material or combinations of materials. Examples of materials that may be used for the source 101, drain 102, first gate 103 and/or second gate 104 include, but are not limited to: metals; conductive or semiconducting metal oxides; conductive or semiconducting polymers; doped semiconductors; graphene; and two-dimensional (2D) semiconductors. Examples of materials that may be used for the semiconductor region 105 include, but are not limited to: crystalline or amorphous silicon; semiconducting metal oxides; transition metal dichalcogenides; graphene; carbon nanotubes; semiconducting nanowires; organic semiconductors; and 2D-semiconductors.

The first gate 103 is disposed over at least part of the source 101, and is separated from the source 101 by the semiconductor region 105 and by an electrical insulator 106 disposed over the semiconductor region 105. The electrical insulator 106 may generally be referred to as an 'insulating region', and may comprise the same material throughout or may comprise different insulating materials in different parts of the device. The region of semiconductor material 105 that is above the source 101 may be referred to as the 'source region' of the semiconductor 105. When a potential difference greater than a certain threshold is applied to the first gate 103, an accumulation layer is formed in the source region at the interface between the semiconductor 105 and the insulator 106. Similarly, the second gate 104 is disposed over a gap 107 between the source 101 and the drain 102, and is separated from the source 101 and the drain 102 by the semiconductor region 105 and by the electrical insulator 106. Depending on the embodiment, the second gate 104 may or may not overlap vertically with the drain 102. When a potential difference greater than a certain threshold is applied to the second gate 104, an accumulation layer is formed in the gap 107 between the source 101 and drain 102 (also referred to as the 'source-drain gap' or 'channel' 107), at the interface between the semiconductor 105 and the insulator 106.

In the present embodiment the applied electric field on the second gate 104 is an applied voltage. However, in another embodiment the applied electric field on the second gate 104 may be an electric field generated by incident electromagnetic radiation via the photovoltaic effect. In this way, the transistor can operate as a phototransistor. Similarly, an electric field that is applied to the first gate 103 may either be an applied voltage, or may be an electric field generated by incident electromagnetic radiation via the photovoltaic effect.

As a further alternative, in some embodiments the electric field that is applied to the first 103 and/or second gate 104 may be generated via a chemical reaction, such as the adsorption of a molecule on the surface of the first or second gate 103, 104. Such embodiments may be used in sensor applications, since the absence/presence of an output current or its magnitude may be indicative of the presence or absence of a particular chemical species capable of being adsorbed onto the surface of the first or second gate 103, 104. When chemical adsorption is used to generate an electric field in a floating-gate embodiment, such as those described below with reference to FIGS. 6 and 23, the adsorption may occur at the control gate above the floating first gate and/or second gate, resulting in an electric field being generated across the floating first gate and/or second gate.

In some embodiments, the multiple-gate transistor 100 can comprise an interfacial layer between the source 101 and the semiconductor region 105 for controlling the properties of the potential barrier. For example, an interfacial layer may be formed by depositing a different material over the source 101 before depositing the semiconductor region 105, or by doping a surface region of the source 101. As a further example, in some embodiments an interfacial layer may be formed by processing the source material before the depositing the semiconductor region 105, for instance by oxidising a surface of the source 101 before depositing the semiconductor region 105, or applying a suitable chemical treatment to alter the surface chemistry of the source material.

In some embodiments, the source 101 may not directly overlap the first gate 103, but instead a region of the semiconductor 105 to one side of the source 101 may be doped to provide a region of overlap with the first gate 103. As a further alternative, in some embodiments a different material may be deposited to one side of the source metallisation 101 in the direction of the drain 102, for example another metal, and the first gate 103 may be formed above, and overlap with, this region of other material adjacent to the source 101.

In the present embodiment, the source 101 and drain 102 are arranged such that when a potential difference greater than a certain threshold is applied across the source 101 and drain 102, a depletion layer is formed in the semiconductor region 105 adjacent to the source 101 across the whole cross-section of the semiconductor layer 105 at the edge of the source 101 closest to the drain 102. In the present embodiment the source 101 comprises a single continuous layer, but in other embodiments the source 101 may comprise a plurality of separate parts electrically connected in parallel to the semiconductor region 105. In some embodiments the depletion layer may not be formed across the whole cross-section of the semiconductor layer 105, although device performance may be compromised as a result due to an increase in saturation voltage and a reduction in intrinsic gain. In contrast to embodiments of the present invention, which function in a similar way to an SGT by forming a depletion region at the edge of the source 101 which allows for source pinch-off, a field-effect transistor uses the field effect to modulate current and may form a depletion region at the edge of the drain, such that pinch-off occurs at the drain. In general, transistors according to embodiments of the present invention can be configured to allow source pinch-off by forming a depletion region at the edge of the source 101 closest to the drain 102.

Together, the first gate 103 and the second gate 104 are configured to cause creation of a continuous conductive layer at the interface between the semiconductor region 105 and the insulator 106. In the present embodiment the conductive layer is an accumulation layer, but in other embodiments an inversion layer may be formed as the conductive layer. In this context, 'continuous' means that the conductive layer extends from the drain 102, across the gap 107 between the source 101 and drain 102, and over at least part of the source 101. The conductive layer therefore provides a path for current to flow between the source 101 and the drain 102 in the semiconductor region 105. In this way, when the correct voltage is applied to both the first and second gates 103, 104, the multiple-gate transistor 100 functions in a similar manner to a conventional SGT.

Figure 2:
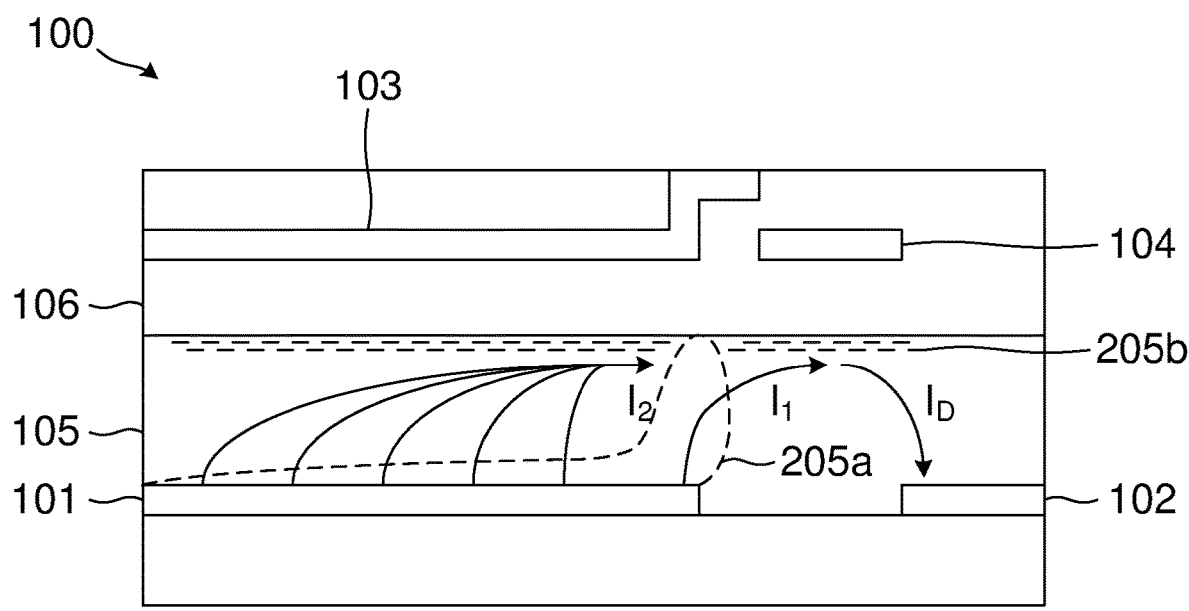
FIG. 2 illustrates an example of mode I and mode II currents in a multiple-gate transistor operating in a similar mode to a source-gated transistor (SGT), according to an embodiment of the present invention.

The operation of the multiple-gate transistor 100 of FIG. 1 can be understood with reference to Mode I and Mode II currents, as shown in FIG. 2. The diagram in FIG. 2 illustrates an example of the multiple-gate transistor 100 when operating in a similar mode to an SGT, according to an embodiment of the present invention. This mode of operation of the multiple-gate transistor 100 may be referred to as an 'SGT-like' mode. In the SGT-like operating mode, two distinct modes of current exist as a consequence of the source pinch off effect. The Mode I current, $I_1$, is determined by the electric field in the depletion region 205a at the tip of the source 101. This can be referred to as the high field mode. Mode I current has a high temperature coefficient and high electric field dependence.

The Mode II current, $I_2$, is injected along the remaining length of the source 101, i.e. away from the source-drain gap, and encounters resistance in the horizontal accumulation layer 205b as it travels through the semiconductor 105 along the length of the source 101. It should be understood that in reality, charges are injected along the source 101 and it is the movement of these charges that is referred to as the Mode II current, $I_2$. As such, references to "injection" of current should be interpreted accordingly. The Mode II current also encounters resistance vertically as it is injected from the source contact 101 and traverses the semiconductor 105, and hence the Mode II current is ohmic in nature. The Mode II current is therefore linearly proportional to the voltage applied to the first gate 103, subject to correct device design in terms of the selection of materials and layer thicknesses. The total current flowing into the drain 102, $I_D$, is equal to the sum of the Mode I and Mode II currents, i.e. $I_D=(I_1+I_2)$.

As described above, in the present embodiment the multiple-gate transistor 100 functions in a similar manner to a conventional SGT when the correct voltage is applied to both the first and second gates 103, 104. However, unlike a conventional SGT, the multiple-gate transistor 100 of the present embodiment comprises a plurality of gates 103, 104. The magnitude of the Mode I and Mode II currents can be controlled by varying the electric field that is applied to the first gate 103, for example by varying a voltage applied to the first gate 103. By providing first and second gates 103, 104 as shown in FIGS. 1 and 2, the first gate 103 can be used to control the injection from the source electrode 101, while the second gate 104 can be used to control the conductive channel between the source 101 and the drain 102. Consequently, the first gate 103 is hereinafter referred to as a "current control gate", and the second gate 104 is hereinafter referred to as a "switching gate".

Additionally, by appropriately designing the current control gate 103 to shield the source 101 from the electric field generated by the switching gate 104, coupling of the switching gate 104 to the source 101 can be reduced. For example, in the present embodiment the current control gate 103 comprises an extending portion 103a which overhangs a gap between the current control gate 103 and the switching gate 104. The extending portion 103a serves to shield the source 101 from the influence of the switching gate 104. Since the current control gate 103 is separated from the switching gate 104 by an insulator 106, different voltages can be applied to the current control gate 103 and the switching gate 104, and the current control gate 103 can electrically shield the source 101 from a potential difference applied to the switching gate 104. In this way, the device operation can be improved since the drain 102 voltage and switching gate 104 voltage will not influence the amount of current that is injected. When voltage is applied to the switching gate 104, current is permitted to flow within the semiconductor region 105 in the gap 107 between the source 101 and the drain 102. This can be considered as switching the transistor from 'off' to 'on', hence the second gate 104 can be referred to as the "switching gate". At the same time, the magnitude of the current flowing between the source 101 and drain 102 is determined by the potential applied to the current control gate 103.

Since the current flowing between the source 101 and the drain 102 scales linearly with the current control gate 103 voltage, the multiple-gate transistor 100 can be considered to behave as a linear variable resistor, or a linear voltage-controlled current source, with an integrated switch, in a single device. If the switching gate 104 is 'on', meaning that the voltage applied to the switching gate 104 is above a certain threshold, and the voltage on the current control gate 103 is also below a corresponding threshold for the current control gate 103, the device remains 'off' and no current will flow between the source 101 and drain 102. Therefore, the switching gate 104 controls the switching on/off behaviour, and the current control gate 103 controls the device as a linear current source while the transistor 100 is in the 'on' state.

Therefore by providing separate current control and switching gates 103, 104, the conduction state of the device (on/off) can be controlled in one part of the device, i.e. by varying the voltage that is applied to the switching gate 104, whilst the magnitude of the current through the multiple-gate transistor 100 can be set in a separate part of the device, i.e. by varying the voltage that is applied to the current control gate 103.

In some embodiments the transistor 100 may be operated in the 'sub-threshold' regime, in which the voltage applied to the switching gate 104 is less than the threshold voltage. Although the transistor 100 may not be considered as being 'fully on' in this state, some current may nevertheless still flow between the source 101 and drain 102 at voltages close to the threshold voltage. In this region of the I-V curve for the transistor 100, the drain current $I_D$ varies exponentially with the voltage applied to the switching gate 104.

In the embodiment shown in FIG. 1, the drain 102 is laterally spaced apart from the source 101, the semiconductor region 105 is disposed over the source 101 and the drain 102, and the current control 103 and switching gates 104 are disposed on an opposite side of the semiconductor region 105 to the source 101 and the drain 102. However, in other embodiments different device geometries are possible. For example, in some embodiments the drain may be disposed above the source, and the control and switching gates may be disposed to one side of the source and drain.

In the present embodiment, the current control gate 103 and the switching gate 104 are disposed at the same height above the source 101 and drain 102. To keep the two gates separate, the current control gate 103 and the switching gate 104 are spaced apart from one another and separated by an electrical insulator 106. Also, to achieve a continuous electric field across the source 101 and the source-drain gap 107, the current control gate 103 comprises a portion 103a that extends above a gap separating the current control gate 103 from the switching gate 104. In other embodiments a similar extending portion may be formed from the switching gate 104 instead of the current control gate 103. However, it can be advantageous to form the extending portion 103a as part of the current control gate 103 as opposed to the switching gate 104, as an extending portion 103a formed from the current control gate 103 can assist in shielding the source 101 from the switching gate 104, as explained above.

As shown in FIG. 1, the portion of the current control gate 103 or the switching gate 104 may extend to at least the same lateral position as an adjacent edge of the other one of the current control gate 103 and the switching gate 104, so that a continuous electric field can be maintained over the source 101 and the source-drain gap 107. In some embodiments the extending portion 103a may overlap the switching gate 104, meaning that part of the extending portion 103a lies directly above part of the switching gate 104. Also, the extending portion 103a is vertically separated from the edge of the other one of the current control gate 103 and the switching gate 104, to ensure that the current control gate 103 and the switching gate 104 are electrically isolated from each other within the device.

Figure 3:
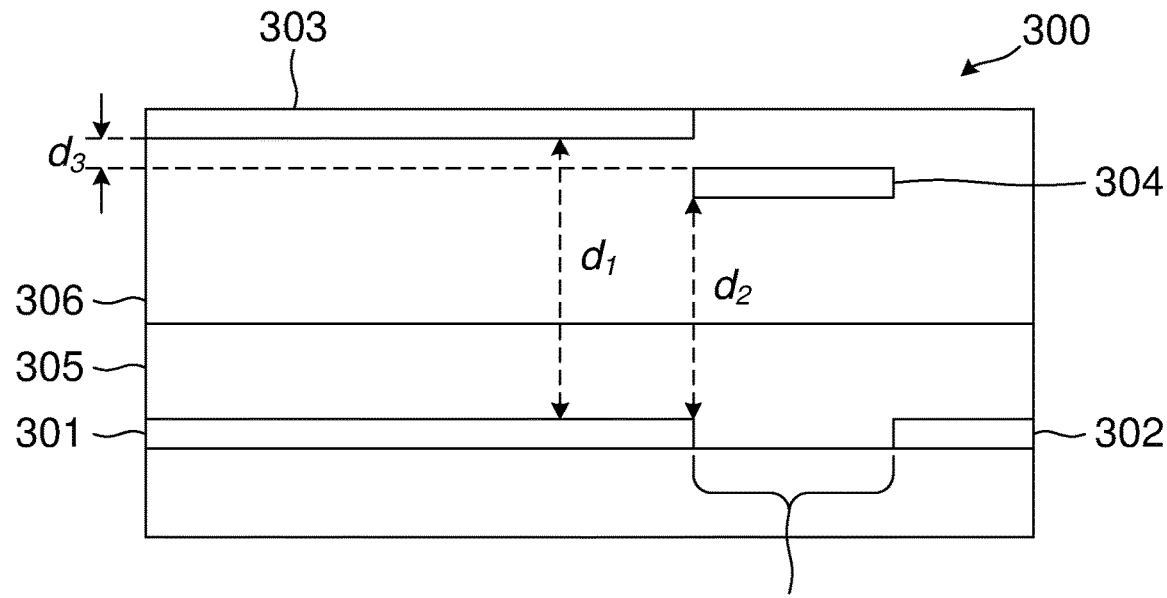
FIG. 3 illustrates a multiple-gate transistor comprising a current control gate vertically offset from a switching gate, according to an embodiment of the present invention.

In another embodiment, as shown in FIG. 3, the current control gate and the switching gate may be vertically offset from one another. The multiple-gate transistor 300 shown in FIG. 3 is similar to the multiple-gate transistor 100 of FIG. 1, and comprises a source 301, drain 302, current control gate 303, switching gate 304, semiconductor region 305 and insulator 306. However, the multiple-gate transistor 300 of the present embodiment differs from the multiple-gate transistor 100 of FIG. 1 in that the current control gate 303 is vertically offset from the switching gate 304. In other words, if the source 301 and the drain 302 are disposed at the same height within the layer structure of the multiple-gate transistor 300, the vertical distance $d_1$ between the source 301 and the current control gate 303 may be different to the vertical distance $d_2$ between the source-drain gap 307 and the switching gate 304. Also, an upper edge of the switching gate 304 is spaced apart from a lower edge of the current control gate 303 by a distance $d_3$, such that the current control gate 303 and the switching gate 304 are not in contact with one another. It will be readily appreciated that in other embodiments the opposite arrangement can be used, that is, the current control gate 303 may be disposed at a lower height than the switching gate 304.

By positioning the current control gate 303 and the switching gate 304 at different heights, the current control gate 303 can extend in a lateral direction at least up to an edge of the switching gate 304 without coming into contact with the switching gate 304. This arrangement can therefore also provide a continuous electric field across the source 301 and the source-drain gap 307 while keeping the current control gate 303 and the switching gate 304 separate. This arrangement may also enable a simplified fabrication process in comparison to the device geometry shown in FIG. 1, since the current control gate 303 and the switching gate 304 can each be formed as a single planar layer within the multiple-gate transistor 300.

However, in some embodiments the current control gate 103, 103a, 303 and the switching gate 104, 304 may together not fully cover the entire length of the gap 107, 307 between the source 101, 301 and drain 102, 302. In other words, in the device orientation shown in FIGS. 1 to 3, the right-most edge of the current control gate 103, 303 and any extending portion 103a may be laterally spaced apart from the left-most edge of the switching gate 104, 304, such that part of the source-drain gap 107, 307 is not covered by either the current control gate 103, 103a, 303 or the switching gate 104, 304. For example, the right-most edge of the current control gate 103, 303 and any extending portion 103a may be laterally spaced apart from the left-most edge of the switching gate 104, 304 by a relatively small gap, of the order of a micron or less. It will be appreciated that such a gap may arise naturally as a result of manufacturing tolerances, depending on the fabrication process used. In general such a gap should be minimised or avoided, since the device linearity and energy efficiency may be negatively affected as the size of a gap between the current control gate 103, 103a, 303 and the switching gate 104, 304 increases.

In the embodiments of FIGS. 1 and 3, the source 101, 301 and the current control gate 103, 303 are disposed on opposite sides of the semiconductor region 105, 305. However, in some embodiments the current control gate metallisation 103, 303 could be in principle on the same side as the source 101, 301, with doping or a semiconductor heterostructure being used to produce an effective potential barrier in the source region that is effectively on the opposite side of the semiconductor region 105, 305 from the current control gate 103, 303.

Figure 4:
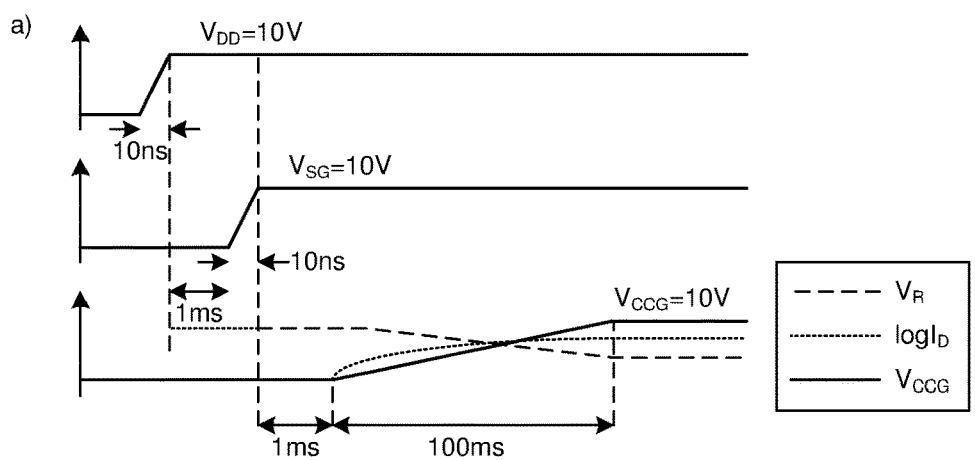
FIG. 4 illustrates timing diagrams showing the ramping of voltage on the current control gate of a multiple-gate transistor before switching the transistor abruptly by increasing the voltage on the switching gate, according to an embodiment of the present invention.
Figure 4:
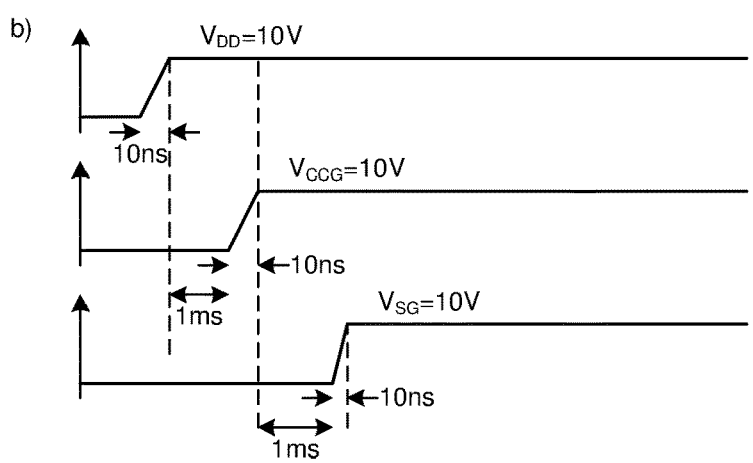

Referring now to FIG. 4, timing diagrams for a multiple-gate transistor similar to the one shown in FIG. 1 are illustrated, according to an embodiment of the present invention. In the graphs illustrated in FIG. 4, plots of voltage versus time are shown when the multiple-gate transistor is placed in a common source amplifier configuration. FIG. 4a illustrates the quasi DC response, and shows the voltage drop in a resistor ($V_R$) connected to the drain due to the drain current when the voltage on the current control gate ($V_{CCG}$) is ramped from 0 V to 10 V, while a voltage of 10 V is applied across the source and drain ($V_{DD}$=10 V) and after the transistor has already been switched to the 'on' state by applying a voltage of 10 V to the switching gate ($V_{SG}$).

Figure 5:
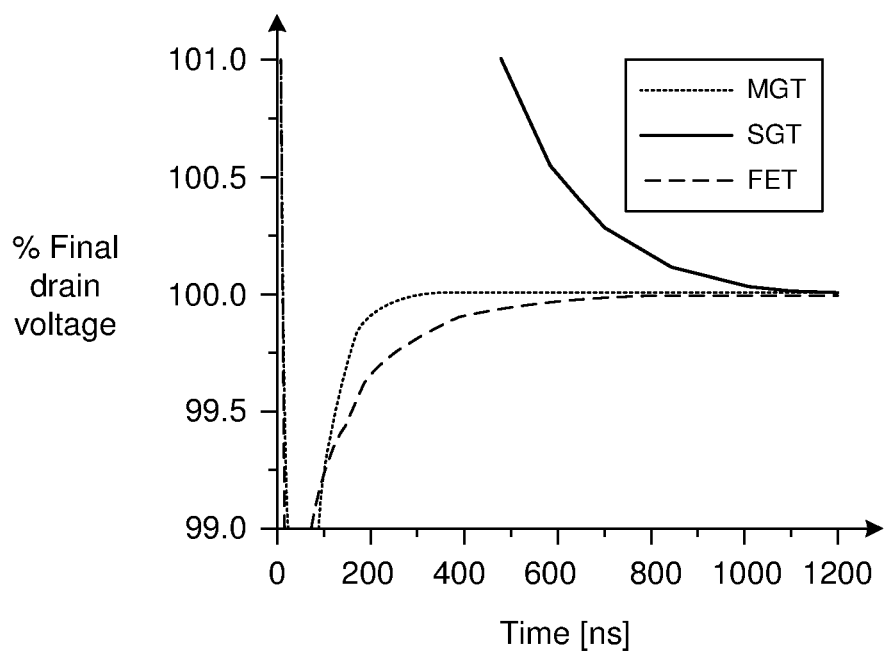
FIG. 5 is a graph comparing the transient response of a multiple-gate transistor according to an embodiment of the present invention with the transient responses of an SGT and a field effect transistor (FET) with similar device geometries.

FIG. 4b illustrates the timing diagram obtained by ramping the voltage on the current control gate, $V_{CCG}$, before switching the transistor abruptly by increasing the voltage on the switching gate, $V_{SG}$, from 0 V to 10 V over a period of 1 nanosecond (1 ns). The transient response of the multiple-gate transistor in this scenario, which is illustrated in FIG. 5, shows that the multiple-gate transistor can operate faster than a SGT and also offers an improvement over conventional thin-film transistor (TFT) performance. The graph in FIG. 5 compares the respective recovery times of a multiple-gate transistor (MGT) to a conventional SGT and FET, represented as a percentage of the final drain voltage. As shown in FIG. 5, the multiple-gate transistor recovers to the final drain voltage more quickly than a conventional SGT or FET.

Without wishing to be bound by any particular theory, it is hypothesised that increase in operating speed of the multiple-gate transistor according to an embodiment of the present invention, versus conventional SGTs and FETs, arises as a consequence of the decoupling of the current injection and device on-off switching mechanisms, which are controlled respectively by the current control gate and switching gate. Unlike a conventional SGT, the multiple-gate transistor remains in the "off" state even after the voltage on the current control gate, $V_{CCG}$, is ramped to a steady state value, until a sufficient switching voltage is applied to the switching gate, $V_{SG}$.

Figure 6:
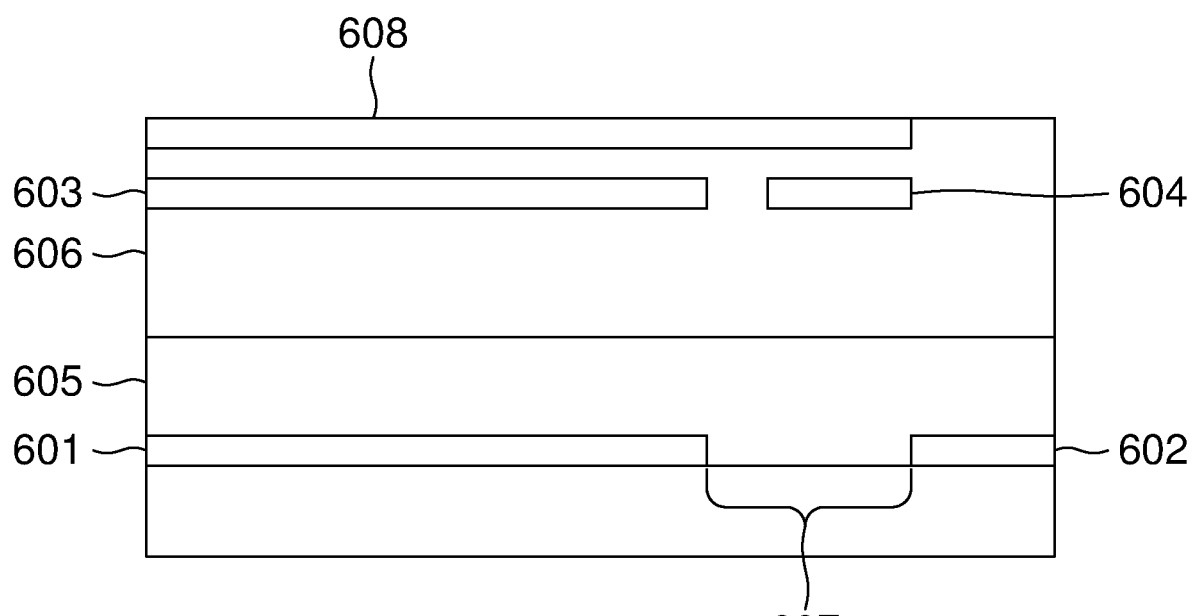
FIG. 6 illustrates a multiple floating-gate transistor comprising two floating gates, according to an embodiment of the present invention.

Referring now to FIG. 6, a multiple floating-gate transistor comprising two floating gates is illustrated, according to an embodiment of the present invention. Like the multiple-gate transistors of the previous embodiments, the multiple floating-gate transistor comprise a source 601, drain 602, current control gate 603, a switching gate 604, a semiconductor region 605 and insulator 606.

However, in the present embodiment a voltage is not applied directly to the current control gate 603 or the switching gate 604. Instead, the transistor further comprises a gate terminal 608 disposed above at least part of the current control gate 603 and at least part of the switching gate 604. In this embodiment, the applied voltage for permitting current to flow between the source 601 and the drain 602 through the semiconductor region 605 is applied to the gate terminal 608, and the current control gate 603 and the switching gate 604 act as floating gates. The control gate 608 above the source-drain gap 607 therefore provides the necessary electric field in order for the transistor to operate. For comparison purposes, an example of an SGT comprising a floating gate (hereinafter referred to as an "FG SGT") is illustrated in FIG. 7, comprising a source 701, drain 702, floating gate 705, semiconductor region 705, insulator 706, and control gate 708.

Figure 7:
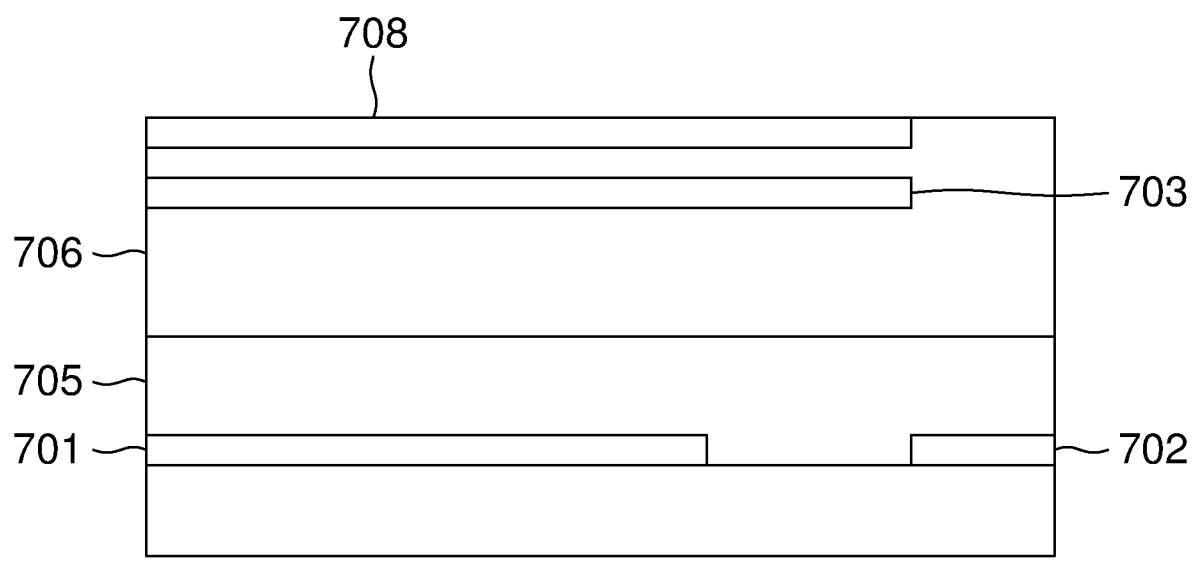
FIG. 7 illustrates an example of a floating gate (FG) SGT.
Figure 8:
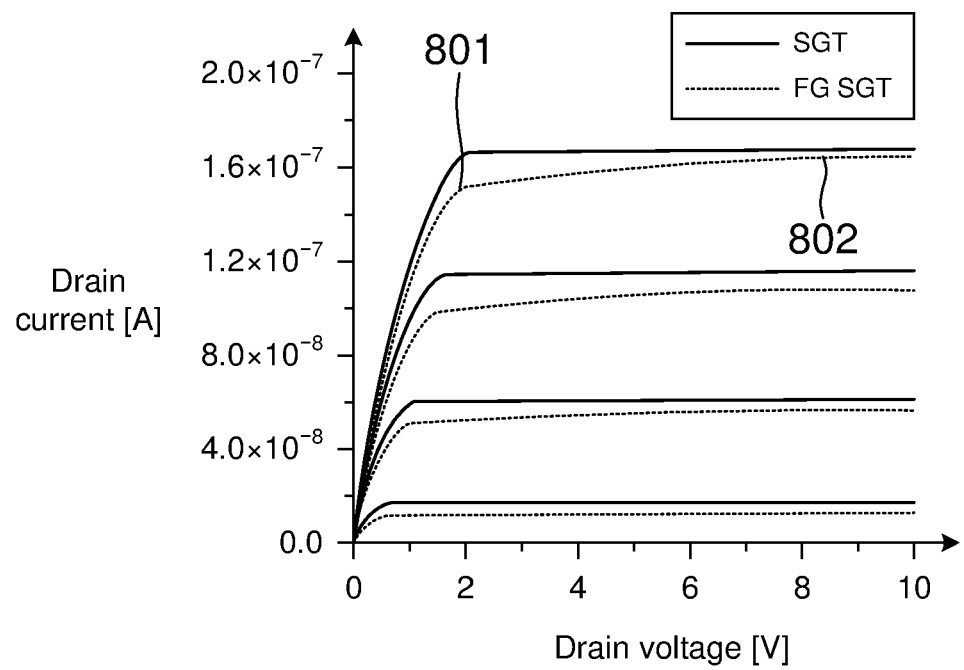
FIG. 8 is a graph showing an example of output characteristics of an SGT and an FG SGT, according to an embodiment of the present invention.

FIG. 8 is a graph showing an example of output characteristics of an SGT and an FG SGT similar to the one shown in FIG. 7. The data plotted in FIG. 8 was obtained from a series of experiments in which voltages of 2.5 V, 5 V, 7.5 V and 10 V were applied to the gate of the SGT, and voltages of 4 V, 8 V, 12 V and 16 V were applied to the gate 708 of the FG SGT. Higher voltages were used for the FG SGT to obtain similar current levels, to enable a direct comparison.

As shown in FIG. 8, the incorporation of a FG onto an SGT has a negative impact on the device performance and causes the SGT to lose its flat output characteristic, which in a normal (i.e. non-FG) SGT is responsible for the high gain of the device. FIG. 8 shows that incorporating a FG results in two saturation points. At the first saturation point 801, the FG SGT initially saturates due to pinch-off at the source, and at the second saturation point 802 the FG SGT finally saturates due to pinch-off at the drain, similar to a conventional TFT. Similar behaviour is also observed in standard SGTs with sources which have been poorly screened from the effect of the changing drain voltage. Between the two saturation points 801, 802 there is a substantial loss in gain (slope>0), which occurs as a result of the channel potential and drain potential capacitively coupling to the FG 703, increasing FG 703 potential, which in turn generates more Mode I and Mode II current. As a consequence of this dual saturation behaviour, the FG SGT does not offer the high-gain advantages of normal SGTs.

Figure 9:
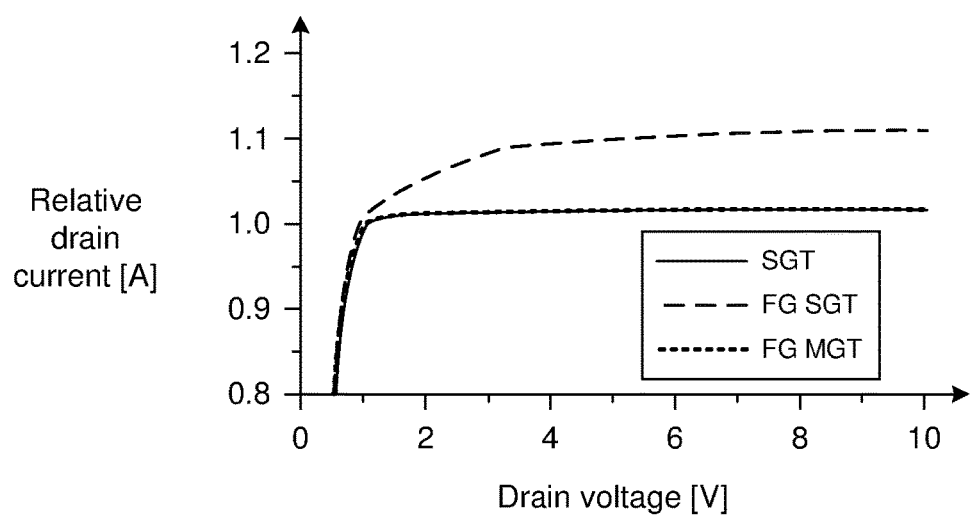
FIG. 9 is a graph comparing the output characteristics of a floating gate multiple-gate transistor (FG MGT) to examples of an SGT and an FG SGT, according to an embodiment of the present invention.

Referring now to FIG. 9, a graph comparing the output characteristics of a multiple floating-gate transistor to examples of an SGT and an FG SGT is illustrated, according to an embodiment of the present invention. In contrast to the FG SGT, splitting the floating gate 703 into a plurality of floating gates 603, 604, as in the floating-gate multiple-gate transistor (FG-MGT) shown in FIG. 6, results in the switching gate 704 coupling to the channel potential and effectively shielding the current control gate 703 from the capacitive coupling. Consequently, a multiple floating-gate transistor according to an embodiment of the present invention is capable of achieving similar performance in terms of gain to an SGT. Additionally, in a multiple floating-gate transistor such as the one shown in FIG. 6 the Mode II current is linearly proportional to the voltage applied to the gate terminal 608 so long as the voltage on the drain 602 is of a sufficient magnitude, in contrast to a conventional FET in which the relationship is quadratic.

In the embodiment shown in FIG. 6, the gate terminal 608 extends across at least the full length of each of the current control gate 603 and the switching gate 604, such that the gate terminal 608 fully overlaps each of the current control gate 603 and the switching gate 604. However, in other embodiments the gate terminal 608 may only partially overlap one or both of the current control gate 603 and the switching gate 604.

Furthermore, in some embodiments the multiple floating-gate transistor may comprise a plurality of switching gates 604 disposed over the gap 607 between the source 601 and drain 602. In such embodiments the gate terminal 608 may extend across, i.e. overlap with, all of the plurality of switching gates 604, such that each one of the plurality of switching gates 604 behaves as a floating gate.

Alternatively, in some embodiments the gate terminal 608 may only extend across, i.e. overlap with, one or more of the switching gates 604 and may not overlap with one or more other ones of the switching gates 604. In such embodiments, the one or more switching gates 604 that are overlapped by the gate terminal 608 may behave as floating gates, whilst the one or more switching gates 604 that are not overlapped by the gate terminal 608 may behave similarly to the switching gates 104,304 described above with reference to the embodiments of FIGS. 1 and 3, or may also behave as floating gates if voltages are not directly applied to each switching gate. The device may then be turned 'on' by applying the threshold switching voltage directly to each of the one or more switching gates 604 that are not overlapped by the gate terminal 608.

Figure 10:
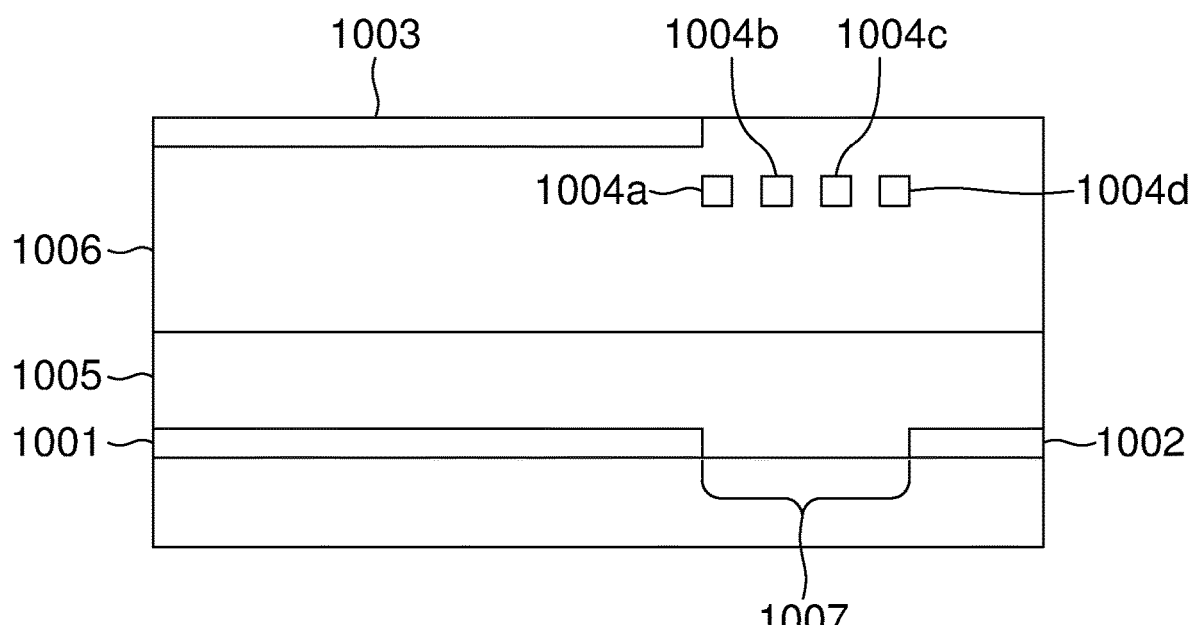
FIG. 10 illustrates a multiple-gate transistor comprising a plurality of switching gates, according to an embodiment of the present invention.

Referring now to FIG. 10, a multiple-gate transistor comprising a plurality of switching gates is illustrated, according to an embodiment of the present invention. The multiple-gate transistor comprises a source 1001, drain 1002, current control gate 1003, a semiconductor region 1005 and insulator 1006. Additionally, in the present embodiment the multiple-gate transistor comprises a plurality of switching gates 1004a, 1004b, 1004c, 1004d disposed above the source-drain gap 1007. Each of the plurality of switching gates 1004a, 1004b, 1004c, 1004d is electrically isolated from other ones of the plurality of switching gates 1004a, 1004b, 1004c, 1004d, and consequently current is only permitted to flow between the source 1001 and drain 1002 through the semiconductor region 1005 when a voltage applied to each one of the plurality of switching gates 1004a, 1004b, 1004c, 1004d is equal to or greater than a respective switching threshold voltage for said one of the plurality of switching gates 1004a, 1004b, 1004c, 1004d.

Figure 11:
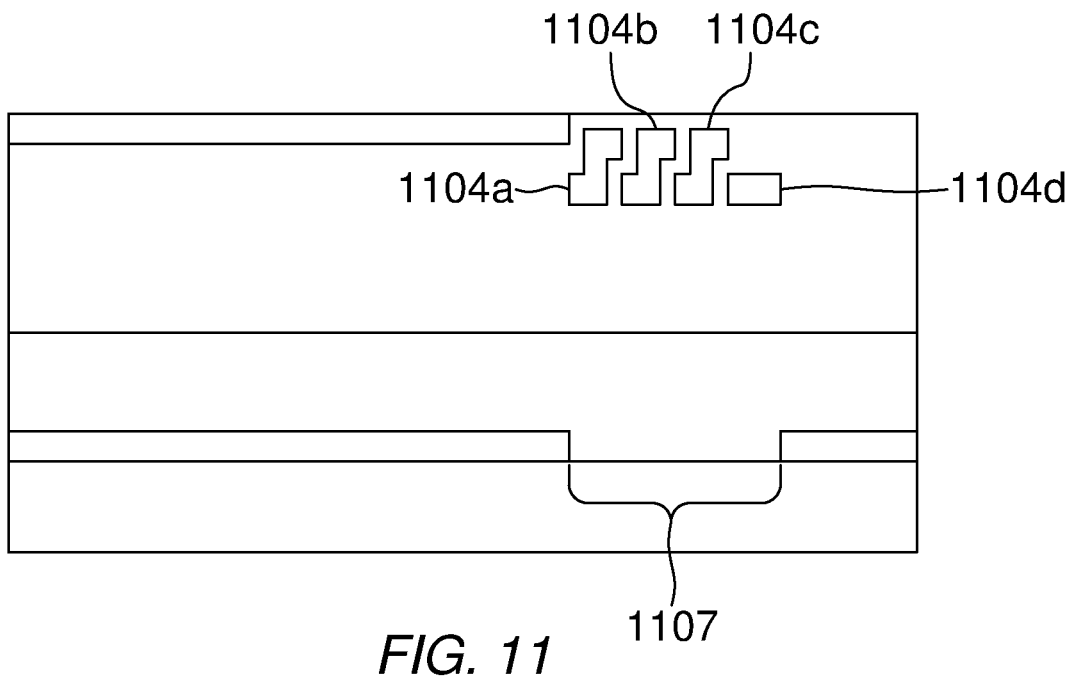
FIG. 11 illustrates a multiple-gate transistor comprising a plurality of switching gates, according to an embodiment of the present invention.

In some embodiments, one or more of a plurality of switching gates may include an extending part similar to the current control gate 103 in the embodiment illustrated in FIG. 1. An example of such an embodiment is illustrated in FIG. 11, in which four switching gates 1104a, 1104b, 1104c, 1104d are disposed at the same height about the source-drain gap 1107. Three of the switching gates 1104a, 1104b, 1104c include a part that extends vertically from an edge of the switching gate and then horizontally across a gap between the switching gate and an adjacent one of the switching gates. As a further alternative, in some embodiments adjacent ones of a plurality of switching gates 1204a, 1204b, 1204c, 1204d may be disposed at different heights above the source-drain gap 1207, as shown in FIG. 12.

Figure 12:
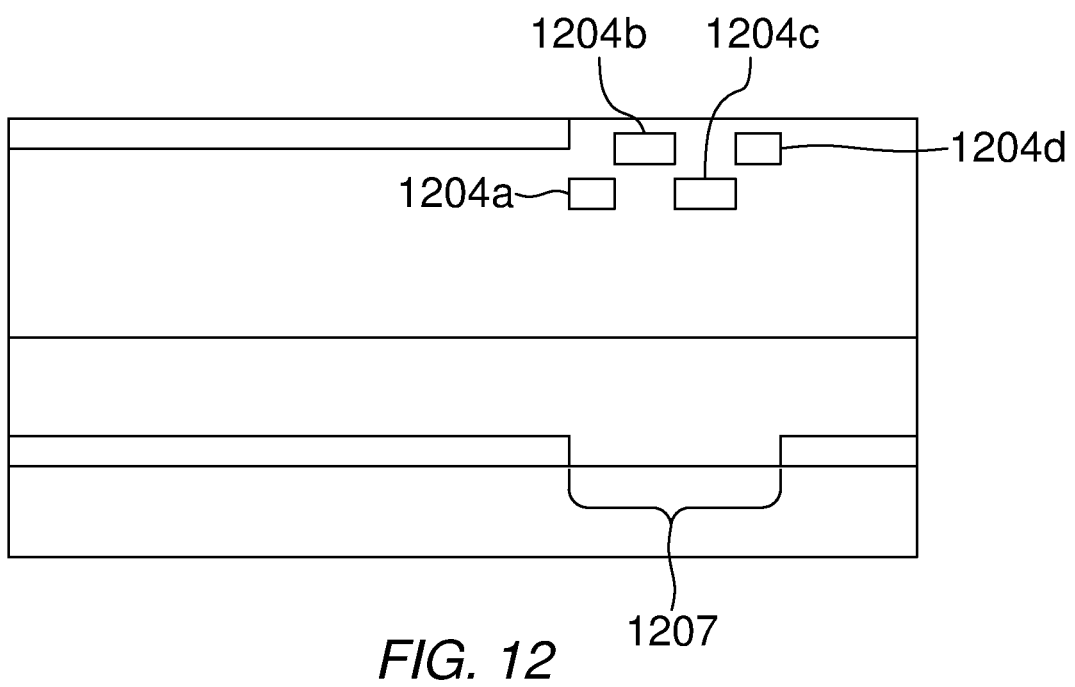
FIG. 12 illustrates a multiple-gate transistor comprising a plurality of switching gates disposed at different heights above the source-drain gap, according to an embodiment of the present invention.

A transistor such as the ones shown in FIGS. 10, 11 and 12 can be used as a multiple input analogue AND gate, by connecting each of the plurality of switching gates 1004a, 1004b, 1004c, 1004d to a respective input, and using the drain as the output of the AND gate. The multiple-gate transistor can then operate as an AND gate by only permitting current to flow at the output if voltages at all of the plurality of inputs are equal to or greater than the switching threshold voltage. The switching threshold voltage may be the same for all of the switching gates 1004a, 1004b, 1004c, 1004d, or may be different for different gates 1004a, 1004b, 1004c, 1004d depending on various factors, including but not limited to the materials used, the distance from each gate 1004a, 1004b, 1004c, 1004d to the semiconductor region 1005, and local properties of the semiconductor region 1005 in the gap 1007 between the source 1001 and drain 1002.

When all of the switching gates 1004a, 1004b, 1004c, 1004d have the respective threshold voltages applied, a continuous electric field is provided along the channel and current is permitted to flow between the source 1001 and drain 1002. Using the transistor in this fashion, combines the AND function given by switching gates 1004a, 1004b, 1004c, 1004d and the ability to pass a current of a magnitude controlled by the potential on 1003. This can be advantageous for space applications or other harsh environments in which devices are exposed to radiation, as the decoupling between the magnitude of the signal (i.e. the signal applied to the current control gate 1003) and the switching behaviour can create a robust electronic platform. Also, by enabling an AND function to be implemented in the analogue domain, a digital control system may no longer be required.

In the embodiments of FIGS. 10, 11 and 12, a multiple-gate transistor comprises a plurality of switching gates. In other embodiments, the current control gate in a multiple-gate transistor may be divided into a plurality of current control gates separated from each other by the insulator, in a similar manner to the switching gate being divided into a plurality of switching gates in the embodiments of FIGS. 10, 11 and 12. In addition to comprising a plurality of current control gates, a multiple-gate transistor can comprise one switching gate or a plurality of switching gates, depending on the embodiment.

Figure 13:
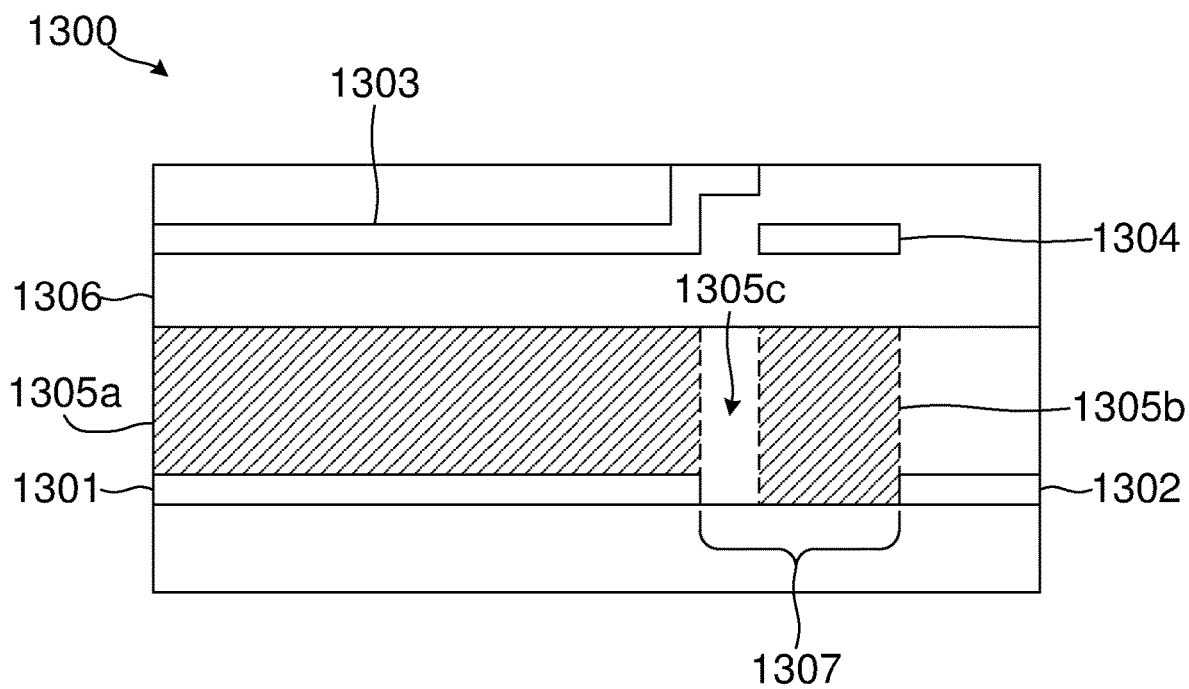
FIG. 13 illustrates a multiple-gate transistor comprising first and second doped regions extending across a full thickness of the semiconductor region, according to an embodiment of the present invention.
Figure 14:
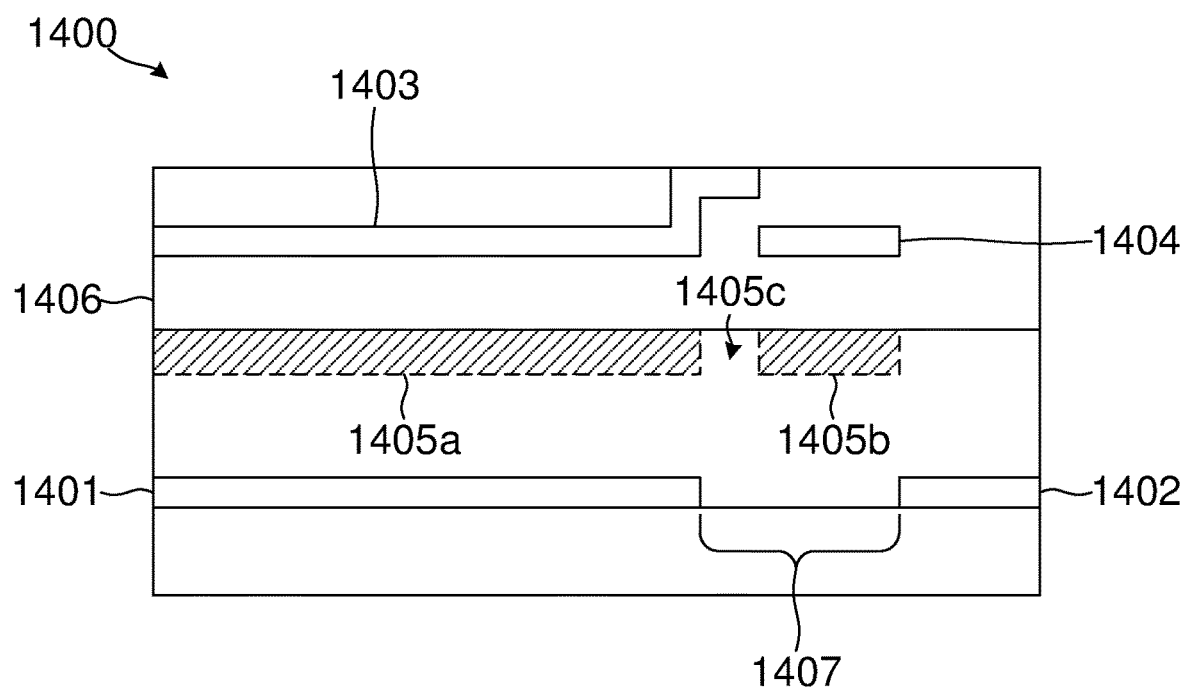
FIG. 14 illustrates a multiple-gate transistor comprising first and second doped regions extending partially across the semiconductor region, according to an embodiment of the present invention.

Referring now to FIGS. 13 and 14, multiple-gate transistors comprising first and second doped regions in the semiconductor region will now be described, according to embodiments of the present invention. Like the embodiment described above with reference to FIG. 1, the multiple-gate transistors 1300, 1400 illustrated in FIGS. 13 and 14 comprise a source 1301, 1401, a drain 1302, 1402, a current control gate 1303, 1403, and a switching gate 1304, 1404. For the sake of brevity, a detailed description of features that are common to the embodiments of FIGS. 1, 13 and 14 will not be repeated here. It will be appreciated that first and second doped regions such as those described here with reference to FIGS. 13 and 14 can also be used in any of the other embodiments described herein, and as such may be combined with features of other embodiments that are not illustrated in FIGS. 1, 13 and 14.

In the embodiment illustrated in FIG. 13, a multiple-gate transistor 1300 comprises first 1305*a* and second 1305*b* doped regions extending across a full thickness of the semiconductor region. In other words, the first doped region 1305*a* and the second doped region 1305*b* each extend from the side of the semiconductor region on which the source 1301 and drain 1302 are disposed to the side on which the insulator 1306 is disposed. In other embodiments, one or both of the first and second doped regions 1305*a*, 1305*b* may only extend partially across the thickness of the semiconductor region. For example, in the embodiment illustrated in FIG. 14 the first and second doped regions 1405*a*, 1405*b* each extend only partially across the thickness of the semiconductor region.

In both embodiments shown in FIGS. 13 and 14, the first doped region 1305*a*, 1405*a* and the second doped region 1305*a*, 1405*a* are separated by a region of undoped semiconductor 1305*c*, 1405*c*. However, in other embodiments the first doped region 1305*a*, 1405*a* and the second doped region 1305*a*, 1405*a* may be immediately adjacent, that is to say, may be in contact with each other. In some embodiments, the first doped region 1305*a*, 1405*a* and the second doped region 1305*a*, 1405*a* may overlap with one another.

In both embodiments shown in FIGS. 13 and 14, the first doped region 1305*a*, 1405*a* is disposed between the source 1301, 1401 and the current control gate 1303, 1403. The behaviour of the transistor 1300, 1400 in response to a voltage applied to the current control gate 1303, 1403 can be controlled by selecting an appropriate dopant species and concentration in the first doped region 1305*a*, 1405*a*. For example, the first doped region 1305*a*, 1405*a* can be made to operate in either an enhancement mode or a depletion mode by selecting a suitable dopant. The enhancement mode may also be referred to as a 'normally off' mode, and the depletion mode may be referred to as a 'normally on' mode.

In this way, the type of doping used in the first doped region 1305*a*, 1405*a* can determine whether the magnitude of current flowing between the source 1301, 1401 and drain 1302, 1402 increases or decreases as the voltage applied to the current control gate 1303, 1403 increases.

Also, in both embodiments shown in FIGS. 13 and 14, the second doped region 1305*b*, 1405*b* is disposed in the channel 1307, 1407. The behaviour of the transistor 1300, 1400 in response to a voltage applied to the switching gate 1304, 1404 can be controlled by selecting an appropriate dopant species and concentration in the second doped region 1305*b*, 1405*b*. For example, the second doped region 1305*b*, 1405*b* can be made to operate in either the enhancement mode or the depletion mode by selecting a suitable dopant. In this way, the second doped region 1305*b*, 1405*b* can determine whether the transistor 1300, 1400 is normally on or normally off when no voltage is applied to the switching gate 1304, 1404.

Depending on the embodiment, the first and second doped regions 1305*a*, 1405*a*, 1305*b*, 1405*b* may operate in the same mode or may operate in different modes. For example, in one embodiment the first doped region 1305*a*, 1405*a* may operate in the enhancement mode, and the second doped region 1305*b*, 1405*b* may operate in the depletion mode, or vice versa.

By providing separate first and second doped regions 1305*a*, 1405*a*, 1305*b*, 1405*b* as shown in FIGS. 13 and 14, and by appropriate choice of dopant species and concentrations, many different combinations of device behaviour can be achieved. This provides circuit designers with greater flexibility. As an example, when a dopant is chosen for the second doped region 1305*b*, 1405*b* that results in the semiconductor region in the channel 1307, 1407 operating in the 'normally on' mode, applying a negative voltage to the switching gate 1304, 1404 which exceeds a threshold switching voltage will cause the transistor 1300, 1400 to turn off. This type of behaviour may be desirable in a circuit in which it is desired to turn off the flow of current when the control voltage applied to the switching gate 1304, 1404 becomes negative. As a further example, in embodiments in which a plurality of current control gates and/or a plurality of switching gates are provided, different doping regions (e.g. using different dopant species, and/or different dopant concentrations) may be provided for different ones of the plurality of gates.

Furthermore, in some embodiments the first doped region 1305*a*, 1405*a* may be omitted, and a multiple-gate transistor may only comprise the doped region 1305*b*, 1405*b* in the channel 1307, 1407. Doping the semiconductor in the channel 1307, 1407 can be used to control the threshold voltage for the switching gate 1304, 1404, in other words, the voltage at which the transistor 1300, 1400 switches on or off. As a further alternative, in some embodiments the second doped region 1305*b*, 1405*b* may be omitted, and a multiple-gate transistor may only comprise the first doped region 1305*a*, 1405*a* above the source. The first doped region 1305*a*, 1405*a* above the source can have the effect of changing the height of the energy barrier in order to provide a barrier of suitable height for desired outcomes such as increased charge injection, linearity or temperature dependence, depending on the desired application.

Figure 15:
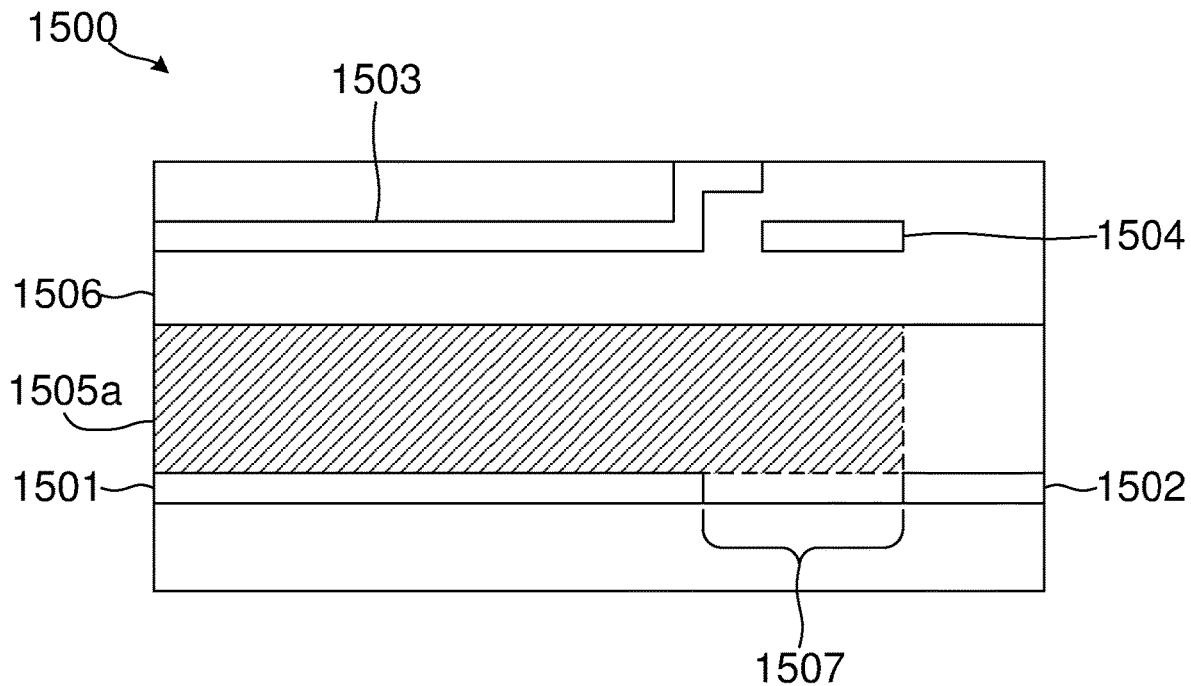
FIG. 15 illustrates a multiple-gate transistor comprising a doped region extending across the source and channel and extending across a full thickness of the semiconductor region, according to an embodiment of the present invention.
Figure 16:
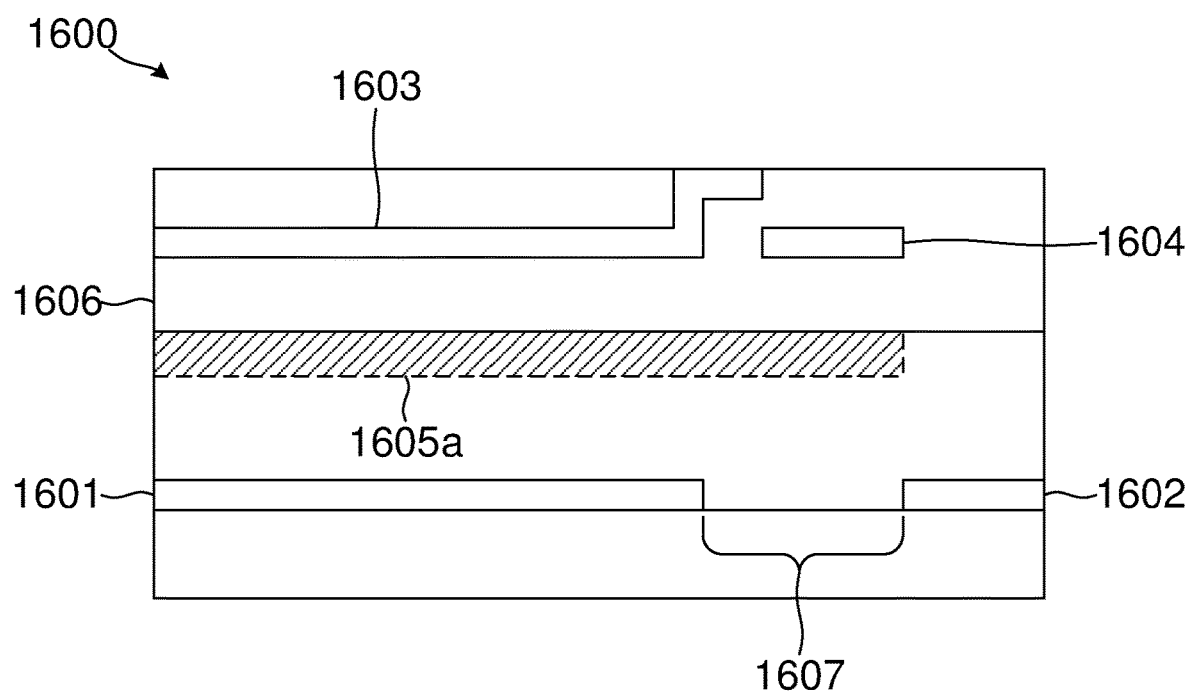
FIG. 16 illustrates a multiple-gate transistor comprising a doped region extending across the source and channel and extending partially across the semiconductor region, according to an embodiment of the present invention.

In other embodiments as shown in FIGS. 15 and 16, a single doped region 1505*a*, 1605*a* may be provided which extends across both the source 1501, 1601 and the channel 1507, 1607, as shown in the embodiments of FIGS. 15 and 16. Using only a single doped region may offer a simplified fabrication process in comparison to embodiments which use more than one doped region, such as those shown in FIGS. 13 and 14. In some embodiments the doped region may extend across the full thickness of the semiconductor region as shown in FIG. 15, whereas in other embodiments the doped region may only extend partially across the thickness of the semiconductor region as shown in FIG. 16.

Like the embodiments of FIGS. 1, 13 and 14, the embodiments of FIGS. 15 and 16 comprise a source 1501, 1601, a drain 1502, 1602, a current control gate 1503, 1603, a switching gate 1504, 1604, and an insulating layer 1506, 1606. For the sake of brevity, a detailed description of features that are common to the embodiments of FIGS. 1, and 13 to 16 will not be repeated here. It will be appreciated that single doped regions such as those described here with reference to FIGS. 15 and 16 can also be used in any of the other embodiments described herein, and as such may be combined with features of other embodiments that are not illustrated in FIGS. 1, 15 and 16.

Figure 17:
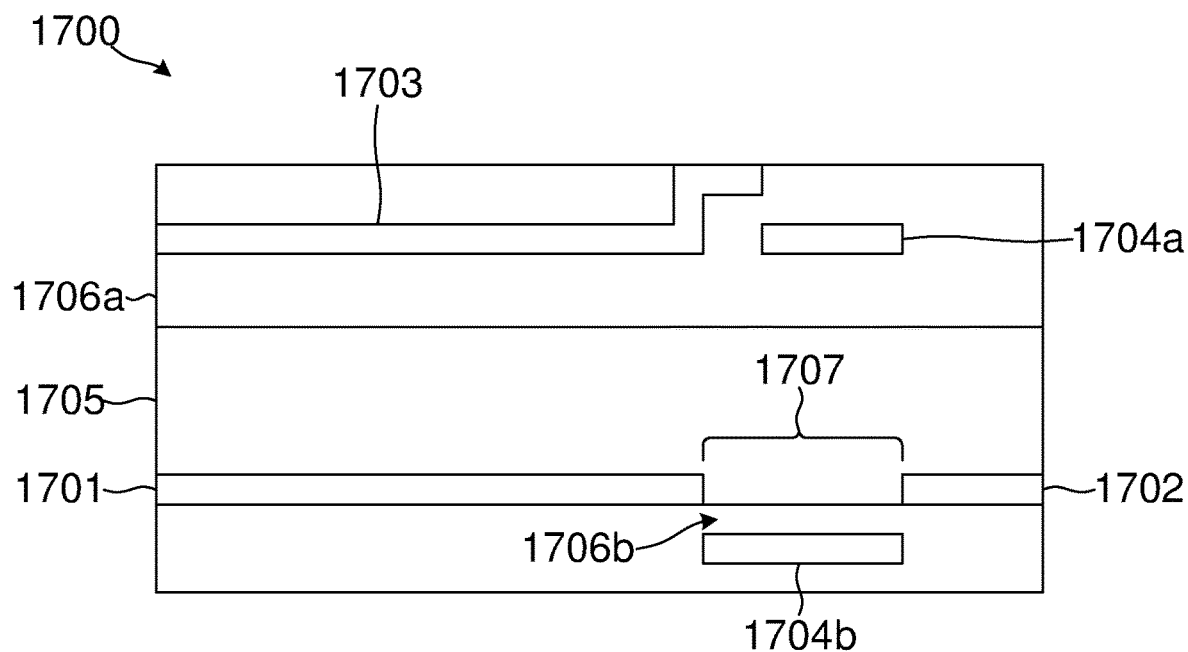
FIG. 17 illustrates a multiple-gate transistor comprising an auxiliary gate electrode disposed on an opposite side of the channel to the switching gate, according to an embodiment of the present invention.

Referring now to FIG. 17, a multiple-gate transistor is illustrated according to an embodiment of the present invention. Like the embodiment of FIG. 1, the multiple-gate transistor 1700 of FIG. 17 comprises a source 1701, a drain 1702, a current control gate 1703, a switching gate 1704a, a semiconductor region 1705, and an insulating layer 1706a, and a detailed description of similar features will not be repeated here. It will be appreciated that features described here in relation to FIG. 17 may also be used in combination with the features of any other described embodiments. In some embodiments the multiple-gate transistor may comprise a plurality of auxiliary gates, in a similar manner to the plurality of switching gates in the embodiments of FIGS. 10 to 12.

In the embodiment of FIG. 17, the transistor 1700 further comprises an auxiliary gate 1704b disposed on an opposite side of the channel 1707 to the switching gate 1704a. In the present embodiment the auxiliary gate 1704b is separated from the semiconductor material in the channel 1707 by an insulator 1706b. The threshold voltage of the switching gate 1704a, which may also be referred to as the switching voltage, can be adjusted by varying a voltage applied to the auxiliary gate electrode 1704b. In other words, the threshold voltage at which the switching gate 1704a permits current to flow between the source 1701 and the drain 1702 is dependent on a voltage applied to the auxiliary gate 1704b. In another embodiment the auxiliary gate may be in direct contact with the semiconductor between the source and drain. In such embodiments, an energy barrier at the interface between the auxiliary gate and the semiconductor may ensure that no current flows from the gate to the semiconductor, in a similar way to a MESFET, whilst still allowing the conductance of the semiconductor between the source and drain to be modulated by applying a potential to the auxiliary gate.

In this way, the auxiliary gate electrode 1704b may perform a similar function to that of the second doped regions 1305b, 1405b described above with reference to FIGS. 13 and 14. However, using an auxiliary gate electrode 1704b instead of semiconductor doping to control the switching voltage of the switching gate 1704a has the added advantage that the switching voltage can be dynamically adjusted, rather than being fixed for any given device. In some embodiments, an auxiliary gate electrode 1704b may be used in combination with a second doped region 1305b, 1405b.

Figure 18:
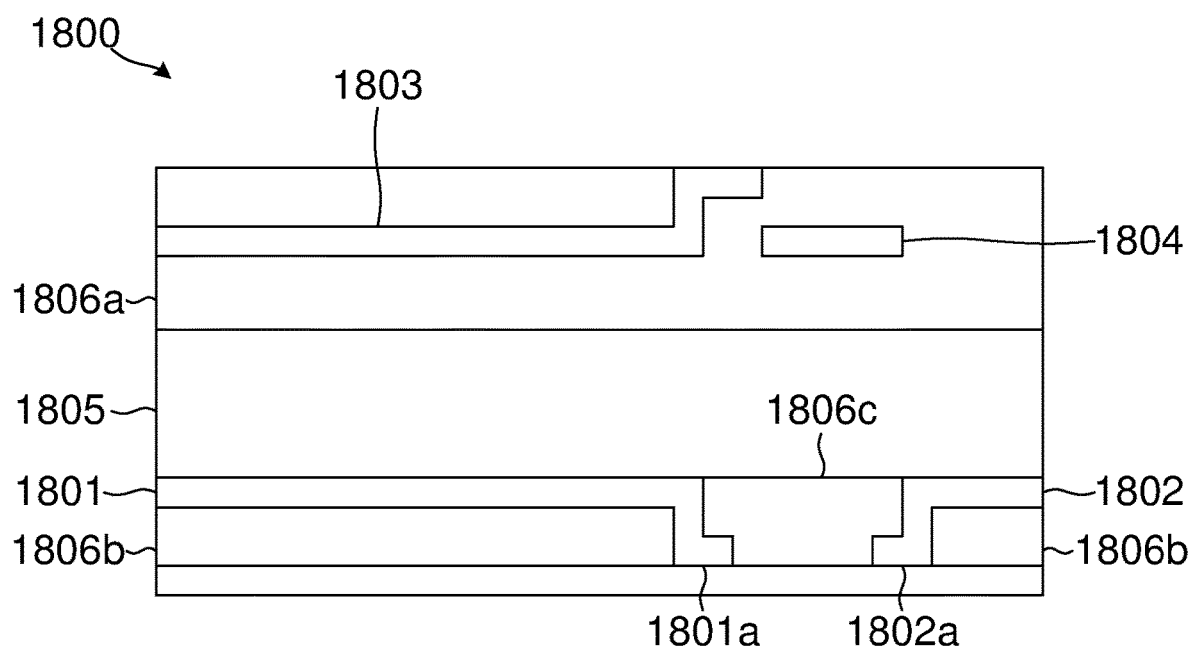
FIG. 18 illustrates a multiple-gate transistor comprising field-relief structures in the source and the drain, according to an embodiment of the present invention.

Referring now to FIG. 18, a multiple-gate transistor comprising field-relief structures in the source and the drain is illustrated, according to an embodiment of the present invention. Like the embodiment of FIG. 1, the multiple-gate transistor 1800 of FIG. 18 comprises a source 1801, a drain 1802, a current control gate 1803, a switching gate 1804, a semiconductor region 1805, and a first insulating layer 1806a, and a detailed description of similar features will not be repeated here. It will be appreciated that features described here in relation to FIG. 18 may also be used in combination with the features of any other described embodiments.

In the embodiment of FIG. 18, the transistor 1800 comprises a second insulating layer 1806b disposed between the substrate and the source 1801 and drain 1802. Additionally, the source 1801 and drain 1802 each comprise respective field-relief structures 1801a, 1802a which extend partially beneath the channel. An insulator 1806c, which is herein referred to as a "field relief insulator", is disposed between the field-relief structures 1801a, 1802a and the semiconductor region, so as to isolate the field-relief structures 1801a, 1802a from the semiconductor region in the channel. The first insulating layer 1806a, second insulating layer 1806b, and the field relief insulator 1806c may be formed from the same insulating material or from different materials.

In some embodiments the transistor 1800 may only comprise the field-relief structure 1801a on the source 1801, and the field-relief structure 1802a on the drain 1802 may be omitted. However, it may be easier to fabricate both field-relief structures 1801a, 1802a together, since additional processing steps may be required to only form a field-relief structure 1801a on the source 1801. For example, in order to only have a source field-relief structure 1801a without a corresponding structure 1802a on the drain, it may be necessary to mask off the source 1801, drain 1802, and the source field-relief structure 1801a, and then etch away the drain field-relief structure 1802a.

The source field-relief structure 1801a extends beyond an edge of the source 1801 nearest to the drain 1802, in a direction towards the drain 1802. In this way, the source field-relief structure 1801a acts to at least partially shield the source 1801 from the lateral electric field in the channel due to the presence of the drain 1802, such that the behaviour of the source 1801 is not influenced by the field from the drain 1802.

Figure 19:
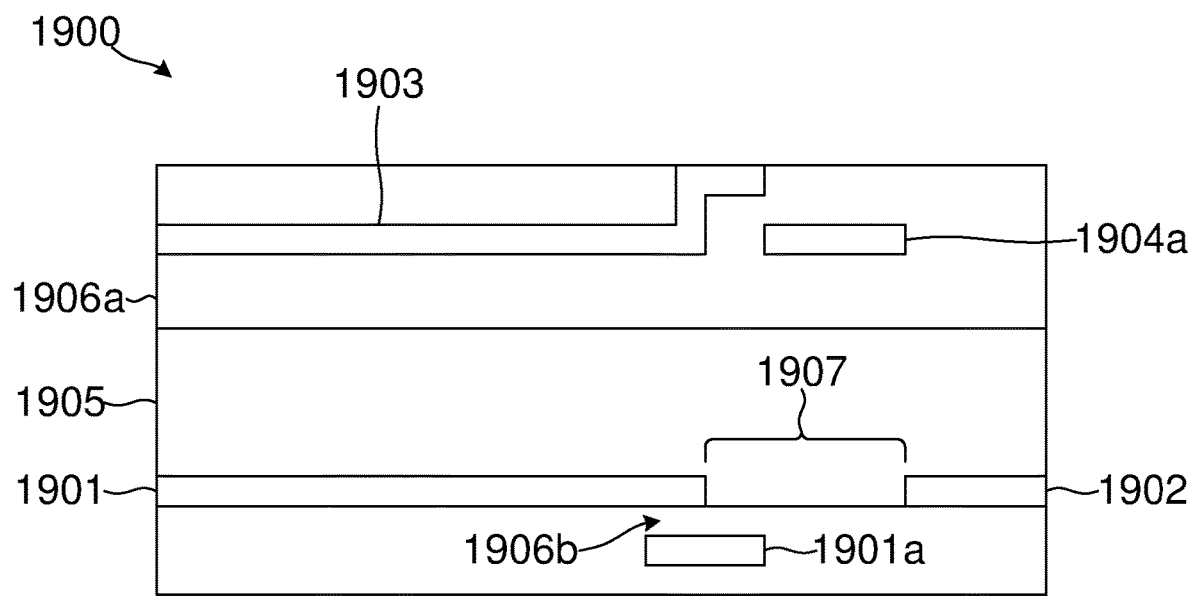
FIG. 19 illustrates a multiple-gate transistor comprising a field-relief electrode, according to an embodiment of the present invention.

As an alternative to the source field-relief structure 1801 in FIG. 18, in another embodiment a separate field-relief electrode may be provided to perform a similar function, as will now be described with reference to FIG. 19. Like the embodiment of FIG. 1, the multiple-gate transistor 1900 of FIG. 19 comprises a source 1901, a drain 1902, a current control gate 1903, a switching gate 1904, a semiconductor region 1905, and an insulating layer 1906a, and a detailed description of similar features will not be repeated here. It will be appreciated that features described here in relation to FIG. 19 may also be used in combination with the features of any other described embodiments.

The field-relief electrode 1901a is disposed beneath an end of the source 1901 adjacent to the channel 1907. The field-relief electrode 1901a partially overlaps the source 1901 and also partially overlaps the channel 1907, as shown in FIG. 19. Furthermore, the field-relief electrode 1901a is separated from both the source 1901 and the channel 1907 by an insulating material 1706b. As with the source field-relief structure 1801a of FIG. 18, the field-relief electrode 1901a of FIG. 19 extends beyond an edge of the source 1901 nearest to the drain 1902, in a direction towards the drain 1902. In this way, the field-relief electrode 1901a acts to at least partially shield the source 1901 from the lateral electric field in the channel 1907 due to the presence of the drain 1902, such that the behaviour of the source 1901 is not influenced by the field from the drain 1902.

As described above with reference to FIG. 1, a potential barrier between the source and the semiconductor region may be provided by suitable selection of materials, or by doping the source and/or semiconductor, or by forming a heterojunction. Embodiments of the present invention which comprise a physical barrier between the source and the semiconductor region will now be described with reference to FIGS. 20 to 22. Depending on the embodiment, a physical barrier may be used alone or in combination with a suitable form of potential barrier such as those described above. The various forms of physical barriers and potential barriers described herein all act as an energy barrier between the source and the semiconductor region, and so can prevent current from flowing between the source and semiconductor at low source-gate voltages.

Figure 20:
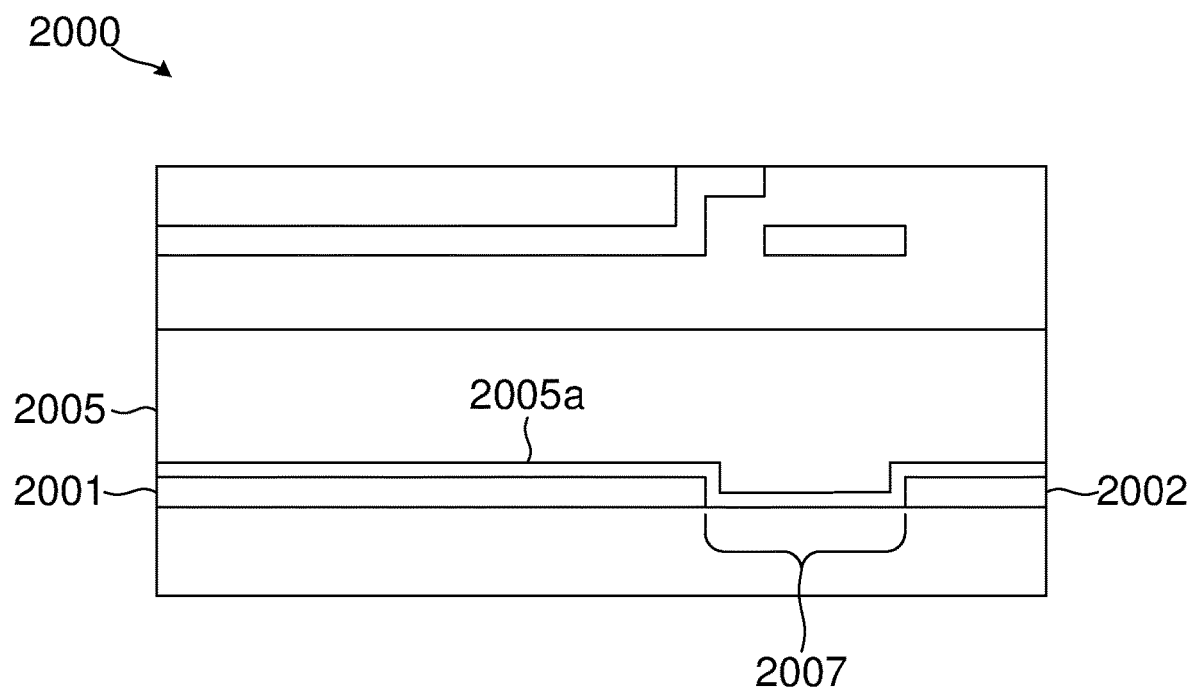
FIG. 20 illustrates a multiple-gate transistor comprising a tunnel layer disposed between the source and the semiconductor region, according to an embodiment of the present invention.

FIG. 20 illustrates a multiple-gate transistor 2000 comprising a tunnel layer 2005a disposed between the source 2001 and the semiconductor region 2005. The tunnel layer 2005a comprises a layer of material that is sufficiently thin to permit electrons or holes to 'tunnel' from one side of the layer to the other when a sufficiently high electric field is applied across the tunnel layer 2005a. The tunnel layer 2005a may comprise an electrically insulating material, or a material that has an energy band structure that provides a suitable energy barrier. In this way the tunnel layer 2005a performs a similar function to a potential barrier, by preventing current flowing from the source 2001 into the semiconductor region 2005 at low source-gate voltages. In the present embodiment the tunnel layer 2005a also extends across the source 2005, the substrate in the channel 2007, and the drain 2002. However, in another embodiment the tunnel layer 2005a may only be disposed over the source 2001, and may not extending across the channel 2007 or the drain 2002.

Figure 21:
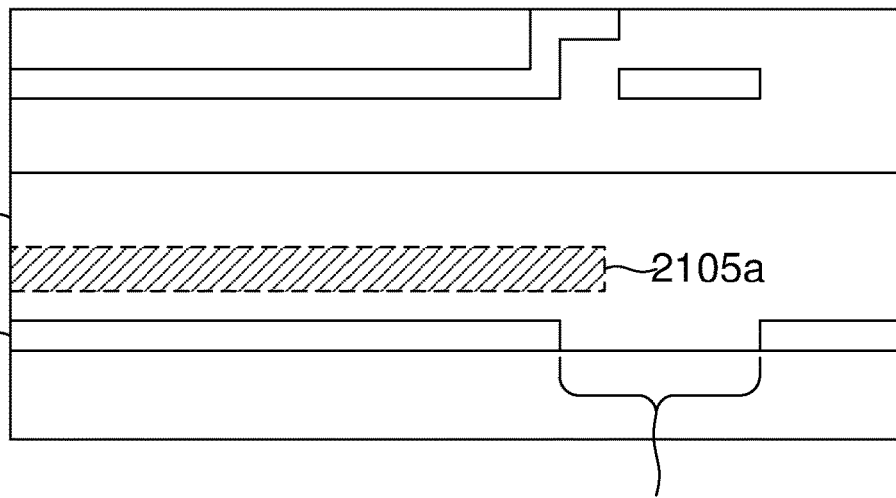
FIG. 21 illustrates a multiple-gate transistor comprising a barrier formed by doping a region of the semiconductor above the source, according to an embodiment of the present invention.

FIG. 21 illustrates a multiple-gate transistor 2100 comprising an energy barrier formed by doping a region 2105a of the semiconductor 2105 above the source 2101. In the present embodiment the doped region 2105a is separated from the source 2101 by a region of undoped semiconductor material 2105. In another embodiment, the doped region 2105a may be immediately adjacent to the source 2101.

In the present embodiment the doped region 2105a extends beyond the end of the source 2101 nearest to the drain 2102, such that the doped region 2105a extends partially into the channel 2107. In this way, the part of the doped region 2105a that extends beyond the edge of the source 2101 may perform a similar function to the source field-relief structure 1801a of FIG. 18 and the field-relied electrode 1901a of FIG. 19, by ensuring that the behaviour of the source 2101 is not influenced by the field over the channel 2107. However, in another embodiment the doped region 2105a may only extend as far as the edge of the source 2101, and may not extend into the channel 2107.

Figure 22:
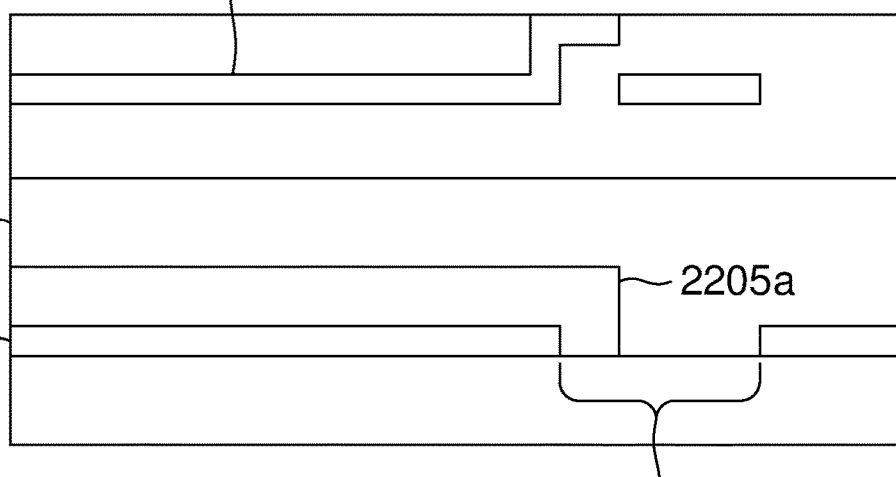
FIG. 22 illustrates a multiple-gate transistor comprising a heterostructure barrier formed by a second semiconductor material disposed between the source and the semiconductor region, according to an embodiment of the present invention.

FIG. 22 illustrates a multiple-gate transistor 2200 comprising a heterostructure energy barrier, according to an embodiment of the present invention. In this embodiment, an energy barrier is provided in the form of a heterostructure comprising two different semiconductor materials. The semiconductor region which separates the source 2201 from the current control gate 2203 comprises a first semiconductor material 2205, and a second semiconductor material 2205a is disposed over the source 2201 between the source 2201 and the first semiconductor 2205. In this way, the interface between the two different semiconductors forms a heterojunction, and acts as an energy barrier to current flowing between the source 2201 and the first semiconductor 2205.

Figure 23:
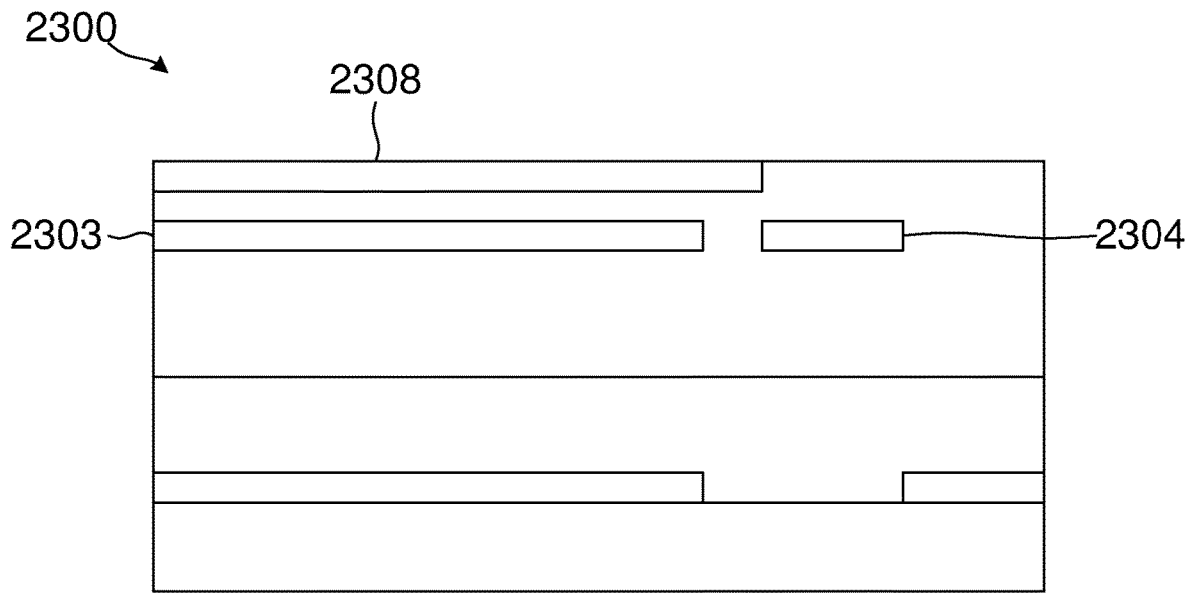
FIG. 23 illustrates a multiple-gate transistor comprising a switching gate electrode and a floating current control gate, according to an embodiment of the present invention.

Referring now to FIG. 23, a multiple-gate transistor 2300 comprising a switching gate electrode and a floating current control gate is illustrated, according to an embodiment of the present invention. This embodiment differs from the floating-gate transistor illustrated in FIG. 6 in that only one of the two gates is a floating gate. In the present embodiment the current control gate 2303 is a floating gate, and the transistor 2300 comprises a gate terminal 2308 disposed above at least part of the current control gate 2303. Unlike the embodiment of FIG. 6, the gate terminal 2308 does not extend above the switching gate 2304. Instead, a voltage is applied directly to the switching gate 2304.

In the present embodiment only the current control gate is embodied as a floating gate, thereby allowing the floating gate function for the source to be separate from the switching function. In another embodiment, the gate terminal 2308 may only be disposed above the switching gate 2304, and may not extend over the current control gate 2303. In this case, the switching gate 2304 behaves as a floating gate, and a voltage may be applied directly to the current control gate 2303. Using a floating switching gate in this way can enable the transistor to be latched in the 'on' or 'off' state.

Although in FIG. 23 a single gate terminal 2308 is illustrated, in some embodiments the gate terminal 2308 may be separated into a plurality of gate terminals that are spaced apart from one another and separated by an insulator. For example, in one embodiment the gate terminal 2308 may be divided into a plurality of separate terminals that are spaced apart from each other in the horizontal direction in FIG. 23.

Figure 24:
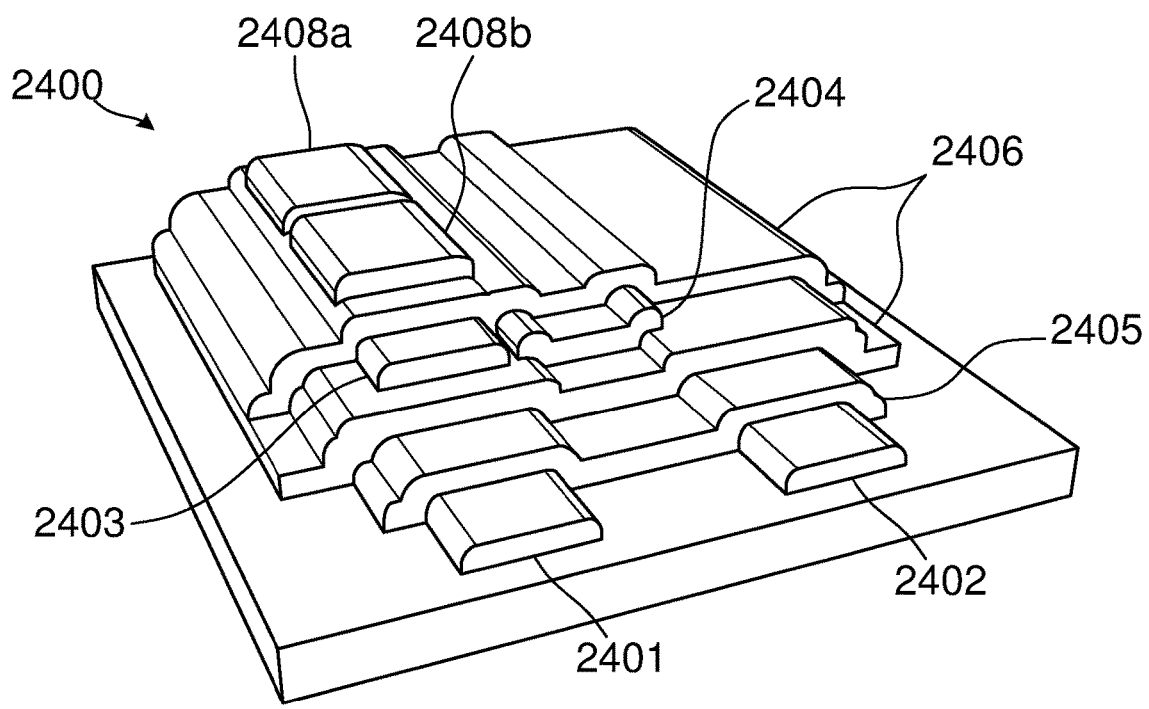
FIG. 24 illustrates a multiple-gate transistor comprising a plurality of input terminals disposed over a floating current control gate, according to an embodiment of the present invention.

Alternatively, the gate terminal 2308 may be divided into a plurality of separate terminals that are spaced apart in a direction perpendicular to the plane of the drawing in FIG. 23. An example of such an embodiment is illustrated in FIG. 24, in which a multiple-gate transistor 2400 comprising a plurality of input terminals 2408a, 2408b disposed over a floating current control gate 2403 is illustrated. Like the transistors of other embodiments described above, the transistor 2400 shown in FIG. 24 also comprises a source 2401, drain 2402, a switching gate 2404, a semiconductor region 2405 and insulating layer 2406, and a detailed description of similar features will not be repeated here.

The transistor 2400 of the present embodiment can be made to perform various functions by applying different voltages to each of the input terminals 2408a, 2408b. For example, the transistor 2400 can be used to sum a plurality of analogue input voltages by applying each input voltage to a different one of the plurality of input terminals 2408a, 2408b. Although only two input terminals 2408a, 2408b are illustrated in FIG. 24, it will be appreciated that in other embodiments any number of input terminals 2408a, 2408b may be provided, depending on the requirements for a particular application. In the present embodiment, each input terminal 2408a, 2408b has the same area and overlaps the floating current control gate 2403 by the same amount, such that each input terminal 2408a, 2408b has the same level of influence over the output current. In this way, the output current produced by the transistor is related to a linear sum of the input voltages.

In embodiments such as the one shown in FIG. 24, each one of the plurality of gate terminals 2408a, 2408b may extend across a full width of the current control gate 2403, or may only extend across a part of the width of the current control gate 2403. By varying the area of overlap between one of the gate terminals 2408a, 2408b and the current control gate 2403, the influence of that gate terminal 2408a, 2408b on the magnitude of the current flowing between the source 2401 and drain 2402 can be controlled.

Figure 25:
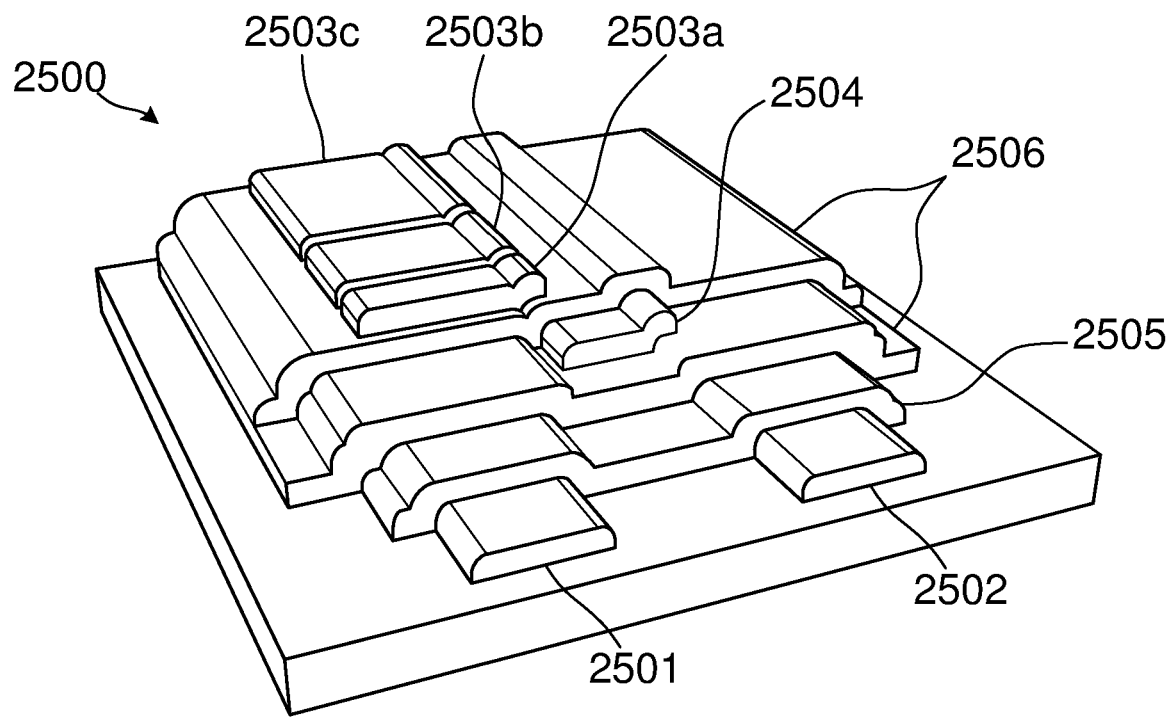
FIG. 25 illustrates a multiple-gate transistor comprising a plurality of current control gates having different areas of overlap with the source, according to an embodiment of the present invention.

A related embodiment will now be described with reference to FIG. 25. Although not a floating-gate transistor, the multiple-gate transistor 2500 illustrated in FIG. 25 is similar to the one shown in FIG. 24 in that the transistor 2500 comprises a plurality of input terminals in the form of current control gates 2503a, 2503b, 2503c spaced apart from one another in a direction perpendicular to the plane of the drawing in FIG. 1. In other words, the plurality of current control gates 2503a, 2503b, 2503c are spaced apart in a direction parallel to the edge of the source 2501 adjacent to the channel between the source 2501 and the drain 2502. Like the transistors of other embodiments described above, the transistor 2500 shown in FIG. 25 also comprises a switching gate 2504, a semiconductor region 2505 and insulating layer 2506, and a detailed description of similar features will not be repeated here.

In the present embodiment, the transistor 2500 is configured to function as a digital-to-analogue converter. In the present embodiment a total of three current control gates 2503a, 2503b, 2503c are illustrated, each of which have different areas of overlap with the source 2501, as shown in FIG. 25. Specifically, the second current control gate 2503b has an area of overlap with the source 2501 that is twice that of the first current control gate 2503a, whilst the third current control gate 2503c has an area of overlap with the source 2501 that is twice that of the second current control gate 2503b. In this is way, the bits of a 3-bit input digital codeword can be applied to respective ones of the current control gates 2503a, 2503b, 2503c. The least significant bit is applied to the first current control gate 2503a, the middle bit is applied to the second current control gate 2503b, and the most significant bit is applied to the third current control gate 2503c. Since the area of overlap of each current control gate is different, the input codewords '011', '101' and '110' will produce different analogue output voltages.

It will be appreciated that a 3-bit input codeword is described purely by way of an example, and additional current control gates may be added following a similar pattern depending on the number of input bits required. In general, if the input digital codeword comprises n bits and the multiple-gate transistor comprises n current control gates each having a different area of overlap with the source, the areas of overlap of the current control gates increase from the first to the nth current control gate and follow a geometric progression with common ratio r=2. In the present embodiment a common ratio of 2 is used to determine the relative areas of the n current control gates, since the input digits are bits (binary digits). In other embodiments the digits of the input digital codeword may represent numbers in a base other than 2, and a suitable common ratio may be chosen accordingly. For example, when octal digits (base 8) are used, the areas of overlap of the current control gates may follow a geometric progression with common ratio r=8. Similarly, when hexadecimal digits (base 16) are used, the areas of overlap of the current control gates may follow a geometric progression with common ratio r=16.

In the above-described embodiments, planar transistor structures are illustrated which can be fabricated by depositing a sequence of layers on top of one another. In some embodiments of the present invention the same principles disclosed above may be applied to circular or concentric transistor structures, examples of which will now be described with reference to FIGS. 26 to 28.

Figure 26:
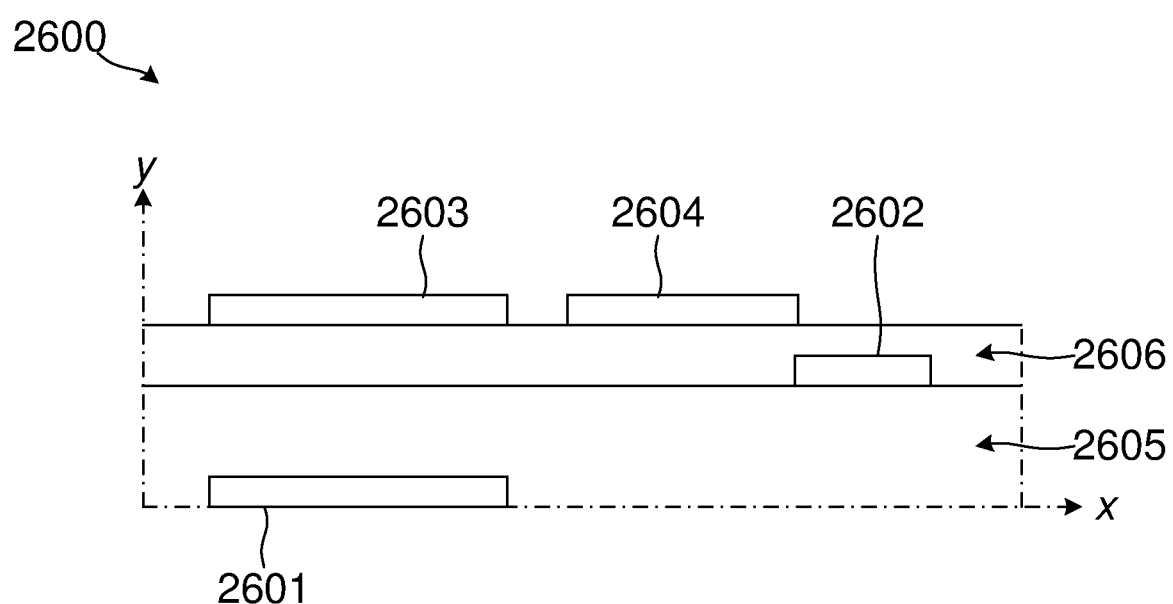
FIG. 26 illustrates a multiple-gate transistor in which the drain is disposed on an opposite side of the semiconductor region to the source, according to an embodiment of the present invention.

FIG. 26 illustrates a transistor structure 2600 in cross-section similar to the embodiment of FIG. 1, comprising a source 2601, drain 2602, current control gate 2603, switching gate 2604, semiconductor region 2605 and insulating layer 2606. However, unlike the embodiment of FIG. 1, in this embodiment the source 2601 and drain 2602 are disposed on opposite sides of the semiconductor region 2605, with the drain 2602 being disposed on the same side of the semiconductor region 2605 as the current control gate 2603 and the switching gate 2604.

In some embodiments a transistor may be fabricated with a concentric circular structure, similar to a Corbino device. The structure of such an embodiment can be understood as being equivalent to the cross-section shown in FIG. 26 rotated through 360° about the y axis. Alternatively, in another embodiment a transistor may be fabricated with a structure equivalent to the cross-section shown in FIG. 26 rotated through 360° about the x axis, for example based on a semiconductor nanowire.

Figure 27:
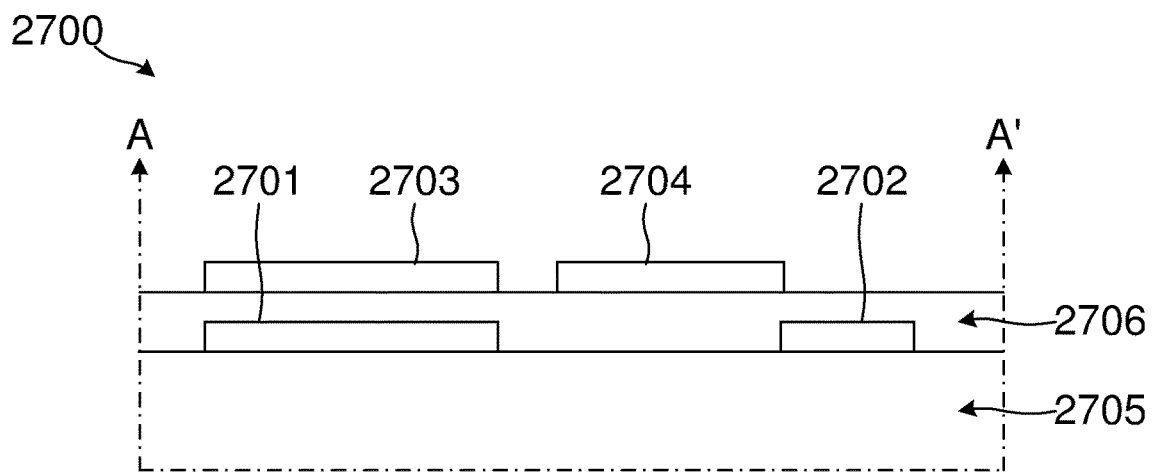
FIG. 27 illustrates a multiple-gate transistor in which the current control gate and the switching gate are disposed on the same side of the semiconductor region as the source and drain, according to an example.
Figure 28:
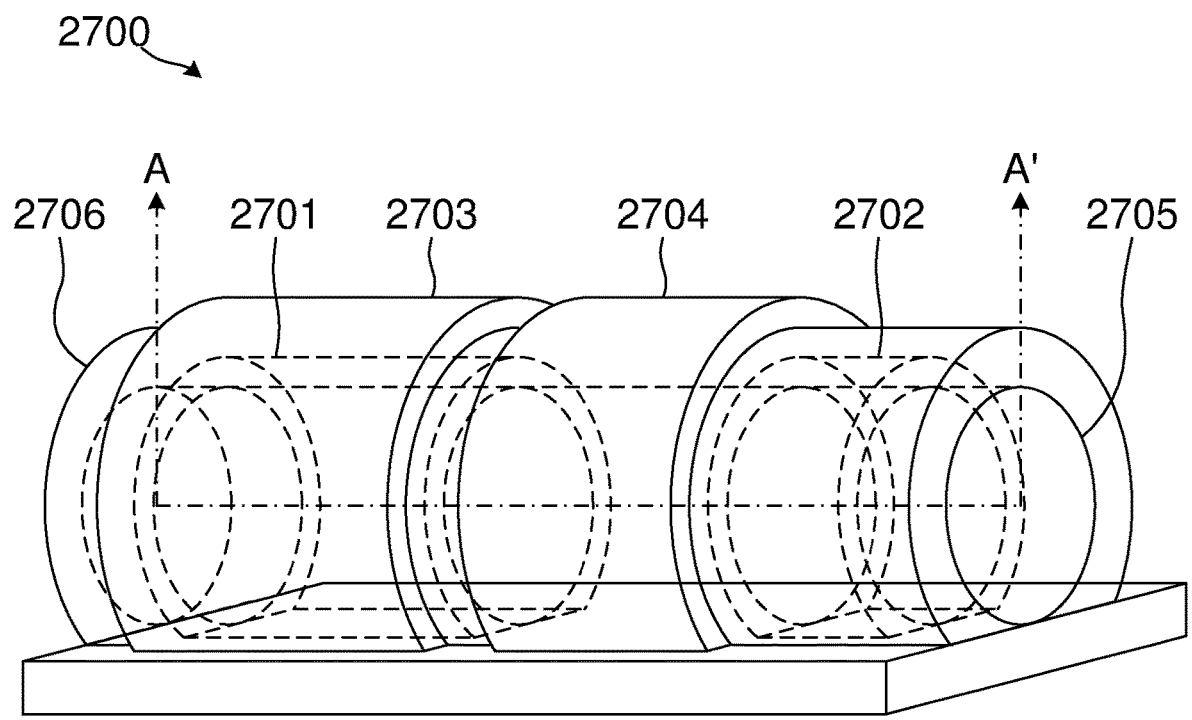
FIG. 28 illustrates a multiple-gate transistor comprising a semiconductor region in the form of a nanowire, according to an example.

Referring now to FIGS. 27 and 28, a nanowire-based multiple-gate transistor 2700 in which the current control gate 2703 and the switching gate 2704 are disposed on the same side of the semiconductor region 2705 as the source 2701 and drain 2702 is illustrated, according to an example. FIG. 28 illustrates a cross-section through the transistor 2700 from A to A'. For example, the transistor 2700 can be fabricated by depositing the source 2701 and drain 2702 on the surface of a semiconductor nanowire 2705, followed by depositing the insulating layer 2706 around the nanowire 2705, source 2701 and drain 2702, and then depositing the current control gate 2703 and switching gate 2704 around the insulating layer 2706. It will also be appreciated that a circular transistor structure could be obtained by rotating the cross-section shown in FIG. 27 about either of the axes labelled A and A'.

Whilst certain embodiments of the invention have been described herein with reference to the drawings, it will be understood that many variations and modifications will be possible without departing from the scope of the invention as defined in the accompanying claims.

The invention claimed is:

1. A multiple-gate transistor comprising:
   a source;
   a drain spaced apart from the source;
   a semiconductor region disposed between the source and the drain;
   an insulating region disposed over the semiconductor region;
   a current control gate for controlling a magnitude of current flowing between the source and the drain through the semiconductor region in dependence on a first electric field applied to the current control gate, the current control gate being separated from the source by the semiconductor region and the insulating region; and
   a switching gate for permitting current to flow between the source and the drain through the semiconductor region in dependence on a second electric field applied to the switching gate.

2. A multiple-gate transistor as claimed in claim 1, wherein the drain is laterally spaced apart from the source, the semiconductor region is disposed over the source and the drain, and the current control and switching gates are disposed on an opposite side of the semiconductor region to the source and the drain.

3. A multiple-gate transistor as claimed in claim 2, wherein the current control gate and the switching gate are disposed at the same height above the source and drain, wherein the current control gate or the switching gate further comprises a portion extending above a gap separating the current control gate from the switching gate.

4. A multiple-gate transistor as claimed in claim 3, wherein the portion of the current control gate or the switching gate extends at least to the same lateral position as an adjacent edge of the other one of the current control gate and the switching gate, and
wherein the portion of the current control gate or the switching gate is vertically separated from the edge of the other one of the current control gate and the switching gate.

5. A multiple-gate transistor as claimed in claim 2, wherein the current control gate is vertically offset from the switching gate.

6. A multiple-gate transistor as claimed in claim 5, wherein the current control gate extends in a lateral direction at least up to an edge of the switching gate, the current control gate being vertically separated from the switching gate by an electrically insulating region.

7. A multiple-gate transistor as claimed in claim 1, wherein the switching gate is disposed so as to cause creation of a conductive layer in part of the semiconductor region between the source and the drain when the second electric field is applied to the switching gate.

8. A multiple-gate transistor as claimed in claim 1, further comprising:
a gate terminal disposed above at least part of the current control gate and at least part of the switching gate,
wherein a third electric field sufficient to generate the first and second electric fields is applied to the gate terminal, and wherein the current control gate and the switching gate act as floating gates.

9. A multiple-gate transistor as claimed in claim 8, wherein the gate terminal extends across the length of the current control gate and the switching gate.

10. A multiple-gate transistor as claimed in claim 1, comprising:
a plurality of switching gates including said switching gate, wherein each of the plurality of switching gates are electrically isolated from other ones of the plurality of switching gates, such that current is only permitted to flow between the source and drain through the semiconductor region when a voltage applied to each one of the plurality of switching gates is equal to or greater than a respective switching threshold voltage for said one of the plurality of switching gates.

11. The multiple-gate transistor of claim 10, further comprising:
a plurality of inputs each connected to a respective one of the plurality of switching gates; and
an output connected to the drain, such that the multiple-gate transistor is configured to perform an AND function by only permitting current to flow at the output if voltages at all of the plurality of inputs are equal to or greater than the switching threshold voltage.

12. A multiple-gate transistor as claimed in claim 1, comprising:
a plurality of current control gates including said current control gate,
wherein the plurality of current control gates are spaced apart from one another in a direction parallel to an edge of the source adjacent to a channel between the source and the drain and are each configured to receive a respective one of a plurality of input voltages, such that the magnitude of current flowing between the source and the drain is dependent on the plurality of input voltages.

13. The multiple-gate transistor as claimed in claim 12, wherein each one of the plurality of current control gates is configured to receive a respective digit of an input digital codeword comprising a plurality of digits, such that the multiple-gate transistor is configured to convert the input digital codeword to an analogue output current at the drain.

14. The multiple-gate transistor as claimed in claim 13, wherein the plurality of digits of the input digital codeword comprises n bits and the multiple-gate transistor comprises n current control gates each having a different area of overlap with the source, and
wherein the areas of overlap of the current control gates increase from the first to the nth current control gate following a geometric progression with common ratio r=2.

15. The multiple-gate transistor as claimed in claim 1, wherein the semiconductor region comprises:
a first doped region between the source and the first gate; and
a second doped region disposed in a channel between the source and the drain.

16. The multiple-gate transistor as claimed in claim 15, wherein the first doped region is configured to operate in a normally on mode and the second doped region is configured to operate in a normally off mode, or wherein the first doped region is configured to operate in the normally off mode and the second doped region is configured to operate in the normally on mode.

17. The multiple-gate transistor as claimed in claim 1, comprising:
an auxiliary gate disposed on an opposite side of the semiconductor region to the switching gate, wherein a threshold electric field at which the switching gate permits current to flow between the source and the drain is dependent on an electric field applied to the auxiliary gate.

18. The multiple-gate transistor as claimed in claim 1, comprising:
a field-relief element configured to extend beyond an edge of the source nearest to the drain, in a direction towards the drain, so as to at least partially shield the source from an electric field in a channel between the source and the drain,
optionally wherein the first and/or second electric field is an applied voltage, or is an electric field generated by incident electromagnetic radiation via the photovoltaic effect, or is an electric field generated by chemical adsorption.

19. A method of operating a multiple-gate transistor comprising a source, a drain spaced apart from the source, a semiconductor region disposed between the source and the drain, an insulating region disposed over the semiconductor region, a current control gate for controlling a magnitude of current flowing between the source and the drain through the semiconductor region in dependence on a first electric field applied to the current control gate, the current control gate being separated from the source by the semiconductor region and the insulating region, and a switching gate for permitting current to flow between the source and the drain through the semiconductor region in dependence on a second electric field applied to the switching gate, the method comprising:

applying the second electric field to the switching gate to permit current to flow in the semiconductor region between the source and the drain; and using the current control gate to control the magnitude of the current flowing in the semiconductor region between the source and the drain.

20. The method of claim 19, wherein the applied second electric field is greater than or equal to a threshold switching electric field, optionally wherein using the current control gate to control the magnitude of the current comprises applying the first electric field to the current control gate, and the multiple-gate transistor is subsequently switched on by increasing the second electric field applied to the switching gate to at least the threshold switching electric field, optionally wherein the multiple-gate transistor comprises a plurality of switching gates including said switching gate, each of the plurality of switching gates being electrically isolated from other ones of the plurality of switching gates such that current is only permitted to flow between the source and drain through the semiconductor region when a respective second electric field applied to each one of the plurality of switching gates is equal to or greater than a respective switching electric field for said one of the plurality of switching gates, the method further comprising applying the respective second electric field greater than or equal to the respective threshold switching electric field to each one of the plurality of switching gates, optionally wherein each one of a plurality of inputs is connected to a respective one of the plurality of switching gates and an output is connected to the drain, such that the multiple-gate transistor is configured to perform an AND function by only permitting current to flow at the output if the respective second electric fields at all of the plurality of inputs are equal to or greater than the respective switching electric fields, optionally wherein the first and/or second electric field is an applied voltage, or is an electric field generated by incident electromagnetic radiation via the photovoltaic effect, or is an electric field generated by chemical adsorption.

* * * * *